United States Patent
Akasaki et al.

(10) Patent No.: US 9,899,553 B2
(45) Date of Patent: Feb. 20, 2018

(54) ADHESIVE SHEET AND PROTECTIVE SHEET FOR SOLAR CELL

(71) Applicant: FUJIFILM Corporation, Tokyo (JP)

(72) Inventors: Yusuke Akasaki, Kanagawa (JP); Naoya Imamura, Kanagawa (JP); Shin Ozawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 300 days.

(21) Appl. No.: 14/018,958

(22) Filed: Sep. 5, 2013

(65) Prior Publication Data

US 2014/0000711 A1    Jan. 2, 2014

Related U.S. Application Data

(63) Continuation of application No. PCT/JP2012/055767, filed on Mar. 7, 2012.

(30) Foreign Application Priority Data

Mar. 7, 2011   (JP) ................................ 2011-049491

(51) Int. Cl.
*H01L 31/049* (2014.01)
*C08J 7/04* (2006.01)
(Continued)

(52) U.S. Cl.
CPC ............ *H01L 31/049* (2014.12); *B32B 27/08* (2013.01); *B32B 27/20* (2013.01); *B32B 27/26* (2013.01);
(Continued)

(58) Field of Classification Search
None
See application file for complete search history.

(56) References Cited

U.S. PATENT DOCUMENTS

2008/0190481 A1    8/2008  Hayes et al.
2010/0000603 A1*   1/2010  Tsuzuki et al. ............... 136/259
(Continued)

FOREIGN PATENT DOCUMENTS

CN    101582458    11/2009
CN    102712774    10/2012
(Continued)

OTHER PUBLICATIONS

Takuma, JP 2010-251679, Adhesive for Solar Cell Module, Sealing Protection Sheet and Solar Cell Module, Nov. 2010, English Machine Translation.*
(Continued)

*Primary Examiner* — Alexander F Ferre
*Assistant Examiner* — Elaine M Vazquez
(74) *Attorney, Agent, or Firm* — Edwards Neils LLC; Jean C. Edwards, Esq.

(57) ABSTRACT

A readily adhesive sheet including a base material film and an olefin-based polymer layer which is disposed on at least one surface of the base material film and contains at least one binder, which is an olefin-based binder having an elastic modulus of 320 MPa or less, at least one coloring pigment selected from titanium oxide, carbon black, titanium black, black combined metal oxides, cyanine-based colors and quinacridone-based colors, and a crosslinking agent has a favorable adhesion to the sealing material even after aged in a hot and humid environment.

30 Claims, 1 Drawing Sheet

(51) Int. Cl.
  *C09J 7/02* (2006.01)
  *B32B 27/30* (2006.01)
  *B32B 27/20* (2006.01)
  *B32B 27/08* (2006.01)
  *B32B 27/26* (2006.01)
  *B32B 27/32* (2006.01)
  *H01L 31/048* (2014.01)
  *C08K 5/00* (2006.01)
  *C08K 3/00* (2006.01)

(52) U.S. Cl.
  CPC ............ *B32B 27/306* (2013.01); *B32B 27/32* (2013.01); *C08J 7/042* (2013.01); *C08J 7/047* (2013.01); *C09J 7/0242* (2013.01); *H01L 31/0481* (2013.01); *B32B 2264/102* (2013.01); *B32B 2264/108* (2013.01); *B32B 2457/12* (2013.01); *C08J 2367/02* (2013.01); *C08J 2423/04* (2013.01); *C08J 2423/10* (2013.01); *C08K 3/0033* (2013.01); *C08K 5/0041* (2013.01); *C09J 2203/322* (2013.01); *C09J 2205/102* (2013.01); *C09J 2423/00* (2013.01); *Y02E 10/50* (2013.01); *Y10T 428/264* (2015.01); *Y10T 428/265* (2015.01); *Y10T 428/273* (2015.01); *Y10T 428/2835* (2015.01); *Y10T 428/2848* (2015.01); *Y10T 428/2857* (2015.01); *Y10T 428/2878* (2015.01); *Y10T 428/2891* (2015.01)

(56) References Cited

U.S. PATENT DOCUMENTS

| | | | |
|---|---|---|---|
| 2010/0275980 A1* | 11/2010 | Karpinski et al. | 136/252 |
| 2011/0277834 A1 | 11/2011 | Hatakeyama et al. | |

FOREIGN PATENT DOCUMENTS

| | | |
|---|---|---|
| JP | 2006-073793 A | 3/2006 |
| JP | 2006-210557 A | 8/2006 |
| JP | 2007-306006 A | 11/2007 |
| JP | 2010-109240 A | 5/2010 |
| JP | 2010-165873 | 7/2010 |
| JP | 2010-251679 A | 11/2010 |
| JP | 2011-029397 A | 2/2011 |
| JP | 2011-146659 | 7/2011 |
| JP | 2012-004546 A | 1/2012 |
| KR | 10-2008-0074102 A | 8/2008 |
| WO | 2007/066718 A1 | 6/2007 |
| WO | WO-2011-087156 | 7/2011 |
| WO | 20121063945 A1 | 5/2012 |

OTHER PUBLICATIONS

Arkema, Range of Ethylene-Acrylic Ester-Maleic Anhydride (MAH) Product Sheet, 2010.*
Yoshiki et al., JP 2010-109240, Solar Cell Back Sheet, May 2010, English Machine Translation.*
Japanese Office Action issued by the Japanese Patent Office dated Mar. 10, 2015 in connection with Japanese Patent Application No. 2012-050096.
Chinese Second Office Action issued by the State Intellectual Property Office (SIPO) of China dated Apr. 3, 2015 in connection with Chinese Patent Application No. 201280011500.4.
International Search Report issued in PCT/JP2012/055767, dated Jun. 12, 2012.
Chinese First Office Action issued by SIPO dated Aug. 14, 2014 in connection with corresponding Chinese Patent Application No. 201280011500.4.
Physical Property Grade List for Bondine, Arkema.
Official Action issued by JPO dated Jun. 17, 2014 in connection with corresponding Japanese Patent Application No. 2012-050096.
Office Action issued by the Korean Patent Office dated Jan. 14, 2016 in connection with Korean Patent Application No. 10-2013-7025438.
Notice of Final Rejection issued by the Korean Patent Office dated Jul. 19, 2016 in connection with Korean Patent Application No. 10-2013-7025438.
Notification of Reason for Refusal issued by the Korean Patent Office dated Mar. 6, 2017 in connection with Korean Jatent Application No. 10-2016-7035352.
Notification of Reason for Refusal issued by the Korean Patent Office on Sep. 25, 2017 in connection with Korean Patent Application No. 10-2016-7035352.

* cited by examiner

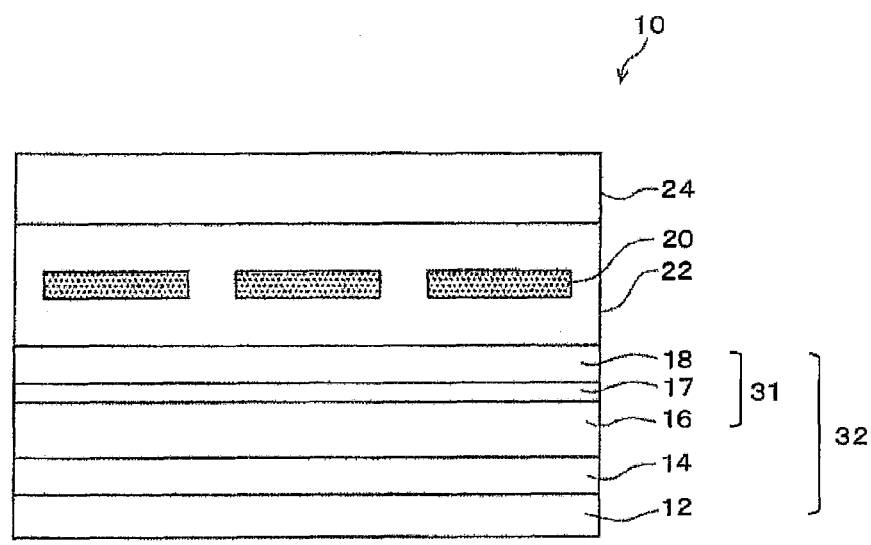

ADHESIVE SHEET AND PROTECTIVE SHEET FOR SOLAR CELL

CROSS-REFERENCE TO RELATED APPLICATIONS

This application is a continuation application of International Application No. PCT/JP2012/055767, filed Mar. 7, 2012, which was published under PCT Article 21(2) in Japanese, which is based upon and claims the benefit of priority from Japanese Application No. 2011-049491, filed Mar. 7, 2011, the disclosures of which Applications are incorporated by reference herein in their entirety.

BACKGROUND OF THE INVENTION

Field of the Invention

The present invention relates to a readily adhesive sheet, a protective sheet for a solar cell, a back sheet member for a solar cell, a back sheet for a solar cell and a solar cell module.

Background Art

In general, a solar cell module in which crystalline silicon, amorphous silicon or the like is used for solar cell elements is manufactured using a lamination method or the like in which a transparent front substrate on a side on which solar light enters, a cell-side substrate in which a solar cell element as a photovoltaic element is sealed with a sealing material, a rear surface protective sheet layer (back sheet for the solar cell) and the like are sequentially stacked, sucked in a vacuum, and hot-pressed. Since a solar cell is placed in an environment exposed to direct sun light and rain, such as on the roof, for a long period of time, the respective layers that configure a solar cell module are required to have a variety of functions typically including durability in a hot and humid environment.

In the past, glass was frequently used for the transparent front substrate or the back sheet for a solar cell; however, in recent years, there has been a demand for use of a protective sheet for a solar cell in which a base material mainly including a resin film is used for the front substrate or the back sheet for a solar cell since a variety of functions can be added by stacking functional layers and the cost can be reduced by decreasing the weight of the solar cell module.

The above protective sheets for a solar cell frequently form a laminate of a variety of functional layers as described above. Examples of typical functional layers include an adhesive layer for closely attaching the laminate to the sealing material, a white layer for increasing the expression efficiency of the solar cell elements by supplying a reflection function of solar light which has transmitted through the transparent front substrate and the cell-side substrate, a weather-resistant layer preferably installed on the outermost layer of the protective sheet for a solar cell, and the like.

Although there are a variety of functions that the protective sheet for a solar cell is required to have as described above, among the functions, there is a particular demand for durability in a hot and humid environment which has a direct influence on the service life of the solar cell module. Particularly, from the viewpoint of the durability of the solar cell module in a hot and humid environment, it is most important to prevent the peeling of the sealing material from the protective sheet for a solar cell and the intrusion of moisture into the cell-side substrate. That is, there is a demand for a protective sheet for a solar cell having a favorable adhesion to a sealing material used in a solar cell module in a hot and humid environment.

However, for the outmost layer of the back sheet for a solar cell which is in contact with the sealing material used in the solar cell module, the adhesion in an ordinary environment let alone the adhesion in a hot and humid environment have been rarely studied. For example, Patent Literature 1 simply describes that a back sheet for a solar cell is stacked on a filler (sealing material) made of an ethylene-vinyl acetate copolymer (hereinafter also referred to as EVA) and does not describe how the back sheet is attached to the filler. In addition, Patent Literature 1 describes a variety of aspects of a layer regarding the outermost layer of the back sheet for a solar cell on the sealing material side, but does not describe the adhesion to the sealing material. In addition, in Patent Literature 2, a back sheet for a solar cell and a sealing material used in a solar cell module are stacked through an extrusion resin layer made of a resin composition and are hot-pressed, but there is no description of the composition or properties of the extrusion resin layer.

Meanwhile, an example in which an adhesive layer is provided between a sealing material used in a solar cell module and the outermost layer of a back sheet for a solar cell on a sealing material side is described. For example, Patent Literature 3 describes a back sheet for a solar cell in which a deposited film of an inorganic oxide is provided on a single surface of a base material film, and heat-resistant polypropylene-based resin films including a whitening agent and an ultraviolet absorbent are stacked on both surfaces of the base material film provided with the deposited film of the inorganic oxide, and Patent Literature 3 discloses an aspect in which a sealing material made of EVA is stacked on the outermost layer of the back sheet for a solar cell using an acrylic adhesive layer in examples.

Meanwhile, in recent years, an example in which the material of the outermost layer of the back sheet for a solar cell on the sealing material side is studied and the direct adhesion between the sealing material used in the solar cell module and the outermost layer of the back sheet for a solar cell on the sealing material side is studied has been also known to a slight extent (refer to Patent Literature 4). Patent Literature 4 describes an aspect in which the back sheet for a solar cell configured of at least two or more layers including a weather-resistant base material film has an adhesive coated layer colored with a white pigment mainly including titanium oxide on an innermost surface that is adhered to a filler configuring a solar cell module of the solar cell back sheet. Patent Literature 4 describes that an acrylic resin, an epoxy-based resin, a phenol-based resin, a polyester-based resin, an urethane-based resin, a styrene-based resin, a silicon-based resin or a modifier thereof is preferably used as a resin for the adhesive coated layer having adhesion to EVA, and the resin preferably includes a polyacrylic resin among the above. In addition, Patent Literature 4 only discloses an aspect in which an adhesive coated layer including an acrylic resin and an acrylic acid resin into which a polyester skeleton has been introduced in examples.

Patent Literature 5 discloses a sheet obtained by coating a coating liquid including an olefin-based resin, an oxazoline compound and silicon, tin, zirconium and aluminum as fine particles on a PET film.

Patent Literature 6 discloses a sheet obtained by coating a coating liquid including an acid-modified polyolefin resin and an oxazoline crosslinking agent on a PET film.

CITATION LIST

Patent Literature

Patent Literature 1: Japanese Patent No. 2006-073793
Patent Literature 2: JP-A-2006-210557

Patent Literature 3: JP-A-2007-306006
Patent Literature 4: JP-A-2010-109240
Patent Literature 5: JP-A-2011-29397
Patent Literature 6: JP-A-2010-251679

SUMMARY OF INVENTION

However, when the inventors manufactured solar cell modules using the methods described in Patent Literature 3 and Patent Literature 4 and aged the solar cell modules in a hot and humid environment, the adhesion between the sealing material in the solar cell module and the protective sheet for a solar cell in a hot and humid environment still remained at an unsatisfactory level.

In addition, while it is described that the sheet described in Patent Literature 6 is excellent in terms of strength-retaining properties in a high temperature and high humidity environment and the like, and SC-50B manufactured by Mitsui chemicals Fabro Inc., that is, standard crosslinking EVA is used in examples of Patent Literature 6, it was found that, in a case in which high-speed crosslinking EVA, use of which has been increased recently since the production efficiency can be improved, was used, the adhesive force failed to reach a desired level, and remained at an unsatisfactory level after the solar cell module was aged in a hot and humid environment.

Therefore, an object of the invention is to provide a protective sheet for a solar cell having a favorable adhesive force to a sealing material even after aged in a hot and humid environment.

As a result of thorough studies for the purpose of achieving the above object, the inventors found that the adhesion of a protective sheet held for 48 hours under environmental conditions of 105° C. and a relative humidity of 100% (aged in a hot and humid environment) can be improved by using a binder having an elastic modulus in a specific range and a specific skeleton and providing a layer to which a specific coloring pigment and a specific crosslinking agent are added.

Particularly, it was found that, compared with a layer to which a specific binder and a specific coloring pigment (titanium or the like) are added, but a crosslinking agent is not added or a layer to which a specific binder and a crosslinking agent are added, but a specific coloring pigment (titanium or the like) is not added, the adhesion of a layer having a specific binder, a specific coloring pigment (titanium or the like) and a crosslinking agent added thereto, which has been held for 48 hours under environmental conditions of 105° C. and a relative humidity of 100% (aged in a hot and humid environment), significantly improves.

That is, the configuration of the invention, which is specific means for achieving the object, is as follows.

[1] A readily adhesive sheet including a base material film; and an olefin-based polymer layer which is disposed on at least one surface of the base material film and contains at least one binder, which is an olefin-based binder having an elastic modulus of 320 MPa or less, at least one coloring pigment selected from titanium oxide, carbon black, titanium black, black combined metal oxides, cyanine-based colors and quinacridone-based colors, and a crosslinking agent.

[2] In the readily adhesive sheet according to [1], the olefin-based binder is preferably an acid-modified olefin-based binder.

[3] In the readily adhesive sheet according to [1] or [2], the acid modification is preferably (meth)acrylic acid.

[4] In the readily adhesive sheet according to any one of [1] to [3], a copolymerization ratio (molar ratio) of an olefin unit to an acid unit in the olefin-based binder is preferably in a range of 99.9:0.1 to 90:10.

[5] In the readily adhesive sheet according to any one of [1] to [4], a melting point of the olefin-based binder is preferably 75° C. or higher.

[6] In the readily adhesive sheet according to any one of [1] to [5], a main chain of the olefin-based binder preferably includes an ethylene unit.

[7] In the readily adhesive sheet according to any one of [1] to [6], the olefin-based binder preferably includes a (meth)acrylic acid ester unit.

[8] In the readily adhesive sheet according to any one of [1] to [7], an amount of the coloring pigment coated on the base material film is preferably 3 g/m$^2$ to 20 g/m$^2$.

[9] In the readily adhesive sheet according to any one of [1] to [8], a volume fraction of the coloring pigment with respect to a total of all the binder resin and the crosslinking agent is preferably 20% to 200% in the colored layer.

[10] In the readily adhesive sheet according to any one of [1] to [9], the coloring pigment is preferably titanium oxide.

[11] In the readily adhesive sheet according to any one of [1] to [10], the crosslinking agent is preferably a compound having an oxazoline group.

[12] In the readily adhesive sheet according to [11], a mass fraction of the compound having an oxazoline group with respect to the olefin-based binder is preferably in a range of 10% to 30%.

[13] In the readily adhesive sheet according to [11] or [12], the compound having an oxazoline group is preferably water-soluble.

[14] In the readily adhesive sheet according to any one of [11] to [13], the compound having an oxazoline group is preferably a copolymer including a (meth)acrylic acid ester unit.

[15] In the readily adhesive sheet according to any one of [1] to [14], a thickness of the olefin-based polymer layer is preferably 30% μm or less.

[16] In the readily adhesive sheet according to any one of [1] to [15], the olefin-based polymer layer is preferably manufactured through coating.

[17] In the readily adhesive sheet according to any one of [1] to [16], a solvent remaining rate in the olefin-based polymer layer is preferably 0.05 mass % or less.

[18] In the readily adhesive sheet according to any one of [1] to [17], the olefin-based polymer layer and the base material film are preferably in direct contact with each other.

[19] The readily adhesive sheet according to any one of [1] to [17] preferably includes at least one separate layer between the olefin-based polymer layer and the base material film.

[20] In the readily adhesive sheet according to [19], a thickness of the separate layer is preferably less than 2 μm.

[21] In the readily adhesive sheet according to [19] or [20], a main component of the separate layer is preferably a polyester-based resin.

[22] The readily adhesive sheet according to any one of [1] to [21] preferably further includes a weather-resistant layer including at least one of a fluororesin and a silicone-acryl composite resin on a surface of the base material film opposite to a surface on which the olefin-based polymer layer is disposed.

[23] In the readily adhesive sheet according to any one of [1] to [22], a surface of the base material film on which the colored layer is disposed preferably has a light reflectivity of 65% or more at a wavelength of 550 nm.

[24] A protective sheet for a solar cell including the readily adhesive sheet according to any one of [1] to [23].

[25] A back sheet member for a solar cell or a back sheet for a solar cell including the readily adhesive sheet according to any one of [1] to [23] or the protective sheet for a solar cell according to [24].

[26] A laminate for a solar cell including the readily adhesive sheet according to any one of [1] to [23] or the protective sheet for a solar cell according to [24]; and a polymer layer which is directly adhered to at least a surface of the readily adhesive sheet or the protective sheet for a solar cell on an olefin-based polymer layer side and includes an ethylene-vinyl acetate copolymer.

[27] A solar cell module including a transparent front substrate on a side on which sun light enters; a solar cell element; a sealing material that seals the solar cell element; and a back sheet for a solar cell which is disposed on the sealing material on an opposite side to the front substrate and is adhered to the sealing material, in which the back sheet for a solar cell includes the back sheet member for a solar cell or the back sheet for a solar cell according to [25], and the olefin-based polymer layer in the back sheet member for a solar cell or the back sheet for a solar cell is directly adhered to the sealing material.

[28] A solar cell module including a transparent front substrate on a side on which sun light enters; a solar cell element; a sealing material that seals the solar cell element; and a back sheet for a solar cell which is disposed on the sealing material on an opposite side to the front substrate and is adhered to the sealing material, in which the laminate for a solar cell according to [26] is included as the back sheet for a solar cell and the sealing material.

According to the invention, a protective sheet for a solar cell having a favorable adhesive force to a sealing material even after aged in a hot and humid environment is provided.

BRIEF DESCRIPTION OF DRAWING

FIG. 1 is a cross-sectional view schematically illustrating an example of a configuration of a solar cell module of the invention.

MODE FOR CARRYING OUT THE INVENTION

Hereinafter, a readily adhesive sheet of the invention, materials used therefor and the like will be described in detail.

The description of configuration requirements described below may be based on typical embodiments of the invention, but the invention is not limited to the above embodiments. Meanwhile, numeric ranges expressed using "to" in the present specification include numeric values described before and after "to" as the lower limit value and the upper limit value.

[Readily Adhesive Sheet]

The readily adhesive sheet of the invention (since the protective sheet for a solar cell of the invention described below includes the readily adhesive sheet of the invention, hereinafter, in a case in which the readily adhesive sheet of the invention is used for a solar cell in the specification, there are cases in which the readily adhesive sheet will be referred to as a protective sheet for a solar cell) includes a base material film; and an olefin-based polymer layer which is disposed on at least one surface of the base material film and contains at least one binder, which is an olefin-based binder having an elastic modulus of 320 MPa or less, at least one coloring pigment selected from titanium oxide, carbon black, titanium black, black combined metal oxides, cyanine-based colors and quinacridone-based colors, and a crosslinking agent.

The above configuration enables the protective sheet for a solar cell of the invention to have a favorable adhesive force to the sealing material after aged in a hot and humid environment. In addition, due to the above characteristics of the protective sheet for a solar cell of the invention, the solar cell module in which the protective sheet for a solar cell of the invention is used can stably maintain power generation performance for a long period of time using the favorable adhesive force of the protective sheet for a solar cell of the invention to the sealing material without causing the peeling of the solar cell module even after aged in a hot and humid environment.

Hereinafter, the protective sheet for a solar cell of the invention will be described.

<Configuration of the Readily Adhesive Sheet>

FIG. 1 illustrates the description of the readily adhesive sheet of the invention, a back sheet member for a solar cell for which the readily adhesive sheet of the invention is used as a protective sheet for a solar cell, a back sheet for a solar cell and a laminate for a solar cell, and an example of the configuration of a solar cell module for which the protective sheet for a solar cell of the invention is used. The protective sheet for a solar cell 31 is provided with an olefin-based polymer layer 18 on one surface of a base material film 16. In a case in which the protective sheet for a solar cell of the invention is used with no weather-resistant layer provided, the protective sheet is also referred to as the back sheet member for a solar cell of the invention. Furthermore, a separate layer 17 may be provided between the base material film 16 and the olefin-based polymer layer 18.

Weather-resistant layers are preferably provided on the other surface of the base material film 16. The base material film 16 is preferably provided with two weather-resistant layers of a first weather-resistant layer 14 and a second weather-resistant layer 12. When the weather-resistant layers 12, 14 are provided, the protective sheet for a solar cell of the invention can be used as a back sheet for a solar cell 32 as it is.

In the back sheet for a solar cell of the invention, the olefin-based polymer layer 18 has a favorable adhesion to a sealing material 22 that seals a solar cell element 20 of a solar cell module 10 even after aged in a hot and humid environment. Therefore, it is not necessary to provide an adhesive layer between the olefin-based polymer layer 18 of the protective sheet for a solar cell of the invention and the sealing material 22 of the solar cell module 10 from the viewpoint of the adhesion even after the olefin-based polymer layer is aged in a hot and humid environment.

Meanwhile, the solar cell module 10 of the invention preferably has a transparent front substrate 24 disposed on the sealing material 22 on an opposite side of the protective sheet for a solar cell of the invention.

<The Respective Configuration Members of the Readily Adhesive Sheet>

Hereinafter, preferable aspects of the respective configuration members that configure the readily adhesive sheet of the invention will be described.

(Base Material Film)

The readily adhesive sheet of the invention has the base material film.

The material of the base material film is not particularly limited, and examples thereof include polyesters such as PET, PEN and PBT; polyphenylene ether; polyolefins such as polypropylene, polyethylene and cyclic olefin copolymers; cellulose acrylate; polycarbonate; acryl; polystyrene; fluorine-based polymers such as polyvinyl fluoride; and the like. The polymer support may have a film shape or a sheet shape. In the back sheet for a solar cell module of the invention, the polymer support preferably includes a crystalline polymer among the above from the standpoint of cost, mechanical strength and the like. The crystalline polymer is preferably a polyester-based crystalline polymer.

The polymer support used in a back sheet for the solar cell module of the invention is more preferably a polyester support from the standpoint of cost, mechanical strength and the like.

The polyester is preferably a linear saturated polyester synthesized from an aromatic diacid or an ester-forming derivative thereof and a diol or an ester-forming derivative thereof.

Specific examples of the linear saturated polyester include polyethylene terephthalate (PET), polyethylene isophthalate, polybutylene terephthalate, poly(1,4-cyclohexylene dimethylene teraphthalate) and polyethylene-2,6-naphthalate.

Among the above, polyethylene terephthalate or polyethylene-2,6-naphthalate is particularly preferable from the standpoint of the balance between dynamic properties and cost.

The polyester may be a homopolymer or a copolymer. Furthermore, the polyester may be a mixture of the polyester and a small amount of another resin, for example, polyimide.

The content of a carboxylic group in the polyester is preferably 50 equivalent amount/t or less and more preferably 35 equivalent amount/t or less with respect to the polyester. When the content of the carboxylic group is 50 equivalent amount/t or less, it is possible to hold hydrolysis resistance and to suppress a decrease in the strength to a small extent when the base material film is aged in a hot and humid environment. The lower limit of the content of the carboxylic group is desirably 2 equivalent amount/t from the standpoint of holding the adhesion to a layer formed in the polyester (for example, a white layer).

The content of the carboxylic group in the polyester can be adjusted by the kind of a polymerization catalyst and film-manufacturing conditions (film-manufacturing temperature or time) used.

As the polymerization catalyst when polymerizing the polyester, a Sb-based, Ge-based or Ti-based compound is preferably used from the viewpoint of suppressing the content of the carboxylic group to a predetermined range or less, and a Ti-based compound is particularly preferable. In a case in which a Ti-based compound is used, the polyester is preferably polymerized using the Ti-based compound in a range of 1 ppm to 30 ppm and more preferably 3 ppm to 15 ppm as a catalyst. When the fraction of the Ti-based compound is in the above range, it is possible to adjust a terminal carboxylic group in the following range, and it is possible to maintain the hydrolysis resistance of a polymer base material at a low level.

For the synthesis of the polyester using the Ti-based compound, the methods described in, for example, JP-B-8-301198, Japanese Patent No. 2543624, Japanese Patent No. 3335683, Japanese Patent No. 3717380, Japanese Patent No. 3897756, Japanese Patent No. 3962226, Japanese Patent No. 3979866, Japanese Patent No. 3996871, Japanese Patent No. 4000867, Japanese Patent No. 4053837, Japanese Patent No. 4127119, Japanese Patent No. 4134710, Japanese Patent No. 4159154, Japanese Patent No. 4269704, Japanese Patent No. 4313538 and the like can be applied.

The polyester is preferably polymerized in a solid state after polymerization. Thereby, a preferable content of the carboxylic group can be achieved. The solid-state polymerization may be a continuous method (a method in which a resin is charged in a tower, is made to slowly stay for a predetermined period of time under heating, and then discharged) or a batch method (a method in which a resin is injected into a container and heated for a predetermined period of time). Specifically, the methods described in Japanese Patent No. 2621563, Japanese Patent No. 3121876, Japanese Patent No. 3136774, Japanese Patent No. 3603585, Japanese Patent No. 3616522, Japanese Patent No. 3617340, Japanese Patent No. 3680523, Japanese Patent No. 3717392, Japanese Patent No. 4167159 and the like can be applied to the solid layer polymerization.

The temperature of the solid-state polymerization is preferably 170° C. to 240° C., more preferably 180° C. to 230° C., and still more preferably 190° C. to 220° C. In addition, the solid-state polymerization time is preferably 5 hours to 100 hours, more preferably 10 hours to 75 hours, and still more preferably 15 hours to 50 hours. The solid-state polymerization is preferably carried out in a vacuum or in a nitrogen atmosphere.

The base material film is preferably a biaxial stretched film obtained by, for example, melting and extruding the polyester into a film shape, cooling and solidifying the polyester in a casting drum so as to produce an unstretched film, stretching the unstretched film in the longitudinal direction once or twice or more at a glass transition temperature Tg° C. to (Tg+60)° C. so that the total magnification becomes 3 times to 6 times, and then stretching the film in the width direction at Tg° C. to (Tg+60)° C. so that the magnification becomes 3 times to 5 times.

Furthermore, the base material film may be a film which has been subjected to a thermal treatment at 180° C. to 230° C. for 1 second to 60 seconds as necessary.

The thickness of the base material film is preferably 25 µm to 300 µm, and more preferably 120 µm to 300 µm. When the thickness is 25 µm or more, a sufficient dynamic strength can be obtained, and, when the thickness is set to 300 µm or less, the base material film is advantageous in terms of costs.

Particularly, when the hydrolysis resistance is enhanced, a polyester base material tends to be available for a long period of time in a hot and humid environment, and, in the invention, in a case in which the thickness of the base material film is 120 µm to 300 µm, and the content of the carboxylic group in the polyester is 2 equivalent amount/t to 50 equivalent amount/t, an effect of further improving durability in a hot and humid environment is exhibited.

(Olefin-Based Polymer Layer)

The readily adhesive sheet of the invention has an olefin-based polymer layer which is disposed on at least one surface of the base material film and contains at least one binder which is an olefin-based binder having an elastic modulus of 320 MPa or less.

The film thickness of the olefin-based polymer layer is preferably 30 µm or less, more preferably 1 µm to 20 µm, particularly preferably 1.5 µm to 15 µm, and more particularly preferably 2 µm to 10 µm. When the film thickness is set to 1 µm or more, decorativeness or reflectivity can be sufficiently developed, and, when the film thickness is set to 30 µm or less, the deterioration of the surface state is suppressed, and the adhesion to the sealing material after the protective film is aged in a hot and humid environment can be improved.

—Binder—

In the invention, as the binder for the olefin-based polymer layer, at least one binder which is an olefin-based binder having an elastic modulus of 320 MPa or less is used.

Examples of an olefin used in the polyolefin resin include polymers of ethylene, propylene, isobutylene and the like, and, among the above, ethylene is preferable. That is, in the readily adhesive sheet of the invention, the main chain of the olefin-based binder used in the olefin-based polymer layer preferably includes an ethylene unit.

In the readily adhesive sheet of the invention, the olefin-based binder used in the olefin-based polymer layer is preferably a modified olefin-based binder, and more preferably an acid-modified olefin-based binder. In the readily adhesive sheet of the invention, as an acidic unit used in the polyolefin resin, which is used in the olefin-based polymer layer, it is preferable to include a (meth)acrylic acid unit, and particularly preferable to include an acrylic acid unit. In addition, in the specification, the acrylic resin includes a resin having an acrylate skeleton and a resin having a methacrylate skeleton. In addition, (meth)acryl collectively refers to acryl and methacryl, and (meth)acrylate collectively refers to acrylate and methacrylate.

Some or all of the acidic unit of the polyolefin resin is preferably neutralized by cation. As the cation, a metal, such as a sodium ion, a zinc ion, a magnesium ion, a copper ion, a lithium ion or a potassium ion, or an amine or ammonia is preferable. A metal ion is preferably a sodium ion, a zinc ion or the like. The amine or ammonia is preferably triethylamine, N,N'-dimethylethanolamine, ammonia or the like.

Examples of the kind of a main chain skeleton of the olefin-based binder include ethylene-acrylic acid ester-maleic anhydride (and/or acrylic acid) copolymers, ethylene-propylene-maleic anhydride (and/or acrylic acid) copolymers, ethylene-butene-maleic anhydride (and/or acrylic acid) copolymers, propylene-butene-maleic anhydride (and/or acrylic acid) copolymers, ethylene-propylene-butene-maleic anhydride copolymers, ethylene-propylene-acrylic acid ester-maleic anhydride (and/or acrylic acid) copolymers, ethylene-butene-acrylic acid ester-maleic anhydride (and/or acrylic acid) copolymers, propylene-butene-acrylic acid ester-maleic anhydride (and/or acrylic acid) copolymers, ethylene-propylene-butene-acrylic acid ester-maleic anhydride (and/or acrylic acid) copolymers and the like.

Preferable examples of the polyolefin resin include polymers made up of ethylene and acrylic acid or ethylene and methacrylic acid.

The copolymerization ratio (molar ratio) of the olefin unit to the acidic unit in the polyolefin resin is preferably 99.7:0.3 to 90:10, and more preferably 99.5:0.5 to 97:3.

In the readily adhesive sheet of the invention, the melting point of the olefin-based binder used in the olefin-based polymer layer is preferably 75° C. or higher, more preferably 85° C. to 105° C., and particularly preferably 90° C. to 95° C.

The elastic modulus of the olefin-based binder used in the invention is 320 MPa, and the elastic modulus of the olefin-based binder is preferably 10 MPa to 250 MPa, more preferably 20 MPa to 150 MPa, particularly preferably 30 MPa to 100 MPa, and most preferably 30 MPa to 70 MPa.

The shape or use pattern of the olefin-based binder is also not particularly limited as long as the polymer layer can be formed. For example, the olefin-based binder may be a water-dispersible olefin-based resin or a meltable olefin-based resin. In addition, the olefin-based binder may be a crystalline olefin-based resin or a non-crystalline olefin-based resin.

In the invention, among the above, an olefin-based binder that is dispersible in a solvent is preferably used since the olefin-based polymer layer can be formed through coating and the adhesion to the sealing material after the protective sheet is aged in a hot and humid environment can be further improved. The olefin-based binder is more preferably dispersible in water.

The procurement method of the olefin-based binder is also not particularly limited, and may be commercially procured or may be synthesized. In addition, the elastic modulus of the olefin-based binder obtained in the invention may be controlled in a range by adding an additive.

Examples of the olefin-based binder used in the invention which can be commercially procured include ARROW BASE SE-1010 manufactured by Unitika Ltd., SE-1013N, SD-1010, which are water dispersions obtained by amine-neutralizing an ethylene-acrylic acid copolymer; TC-4010 and TD-4010, which are water dispersions obtained by amine-neutralizing a propylene-acrylic acid copolymer; HITECH S3148, S3121 and S8512 (manufactured by Toho Chemical Industry Co., Ltd.), which are water dispersions obtained by ammonia-neutralizing an ethylene-(meth)acrylic acid copolymer; CHEMIPEARL S-120, S-75N, V100, EV210H (all manufactured by Mitsui Chemicals, Inc.), which are water dispersions of ionomers of ethylene-acrylic acid copolymers; and the like. Among the above, in the invention, ARROW BASE SE-1013N manufactured by Unitika Ltd. is preferably used. Meanwhile, the melting point of ARROW BASE SE-1013N is about 91° C., and the copolymerization ratio (molar ratio) of the olefin unit to the acidic unit is 99:1.

In addition, the copolymerization ratio (molar ratio) of the olefin unit to the acidic unit of HITECH S3121 is 95:5.

The olefin-based binder used as the binder for the olefin-based polymer layer may be used solely, or a mixture of a plurality of the olefin-based binders may be used.

The binder for the olefin-based polymer layer may include binders other than the olefin-based binder within the scope of the purport of the invention.

Examples of the other binders include polyurethane-based binders. Examples of the polyurethane-based binder include SUPER FLEX 110 AND 460, all manufactured by Daiichi Kogyo Seiyaku Co., Ltd., and the like. The ratio (mass ratio) of the olefin-based binder to the other binder is preferably 50:50 to 100:0 and more preferably 80:20 to 100:0.

—Coloring Pigment—

In the readily adhesive sheet of the invention, the olefin-based polymer layer is a colored layer containing at least one coloring pigment selected from titanium oxide, carbon black, titanium black, black combined metal oxides, cyanine-based colors and quinacridone-based colors.

A first function of the colored layer is to increase the power generation efficiency of the solar cell module by reflecting light of incident light, which has reached the back sheet without being used for power generation in the solar battery cell, so as to return the light to the solar battery cell. A second function is to improve the decorativeness of the appearance of the solar cell module when seen from the surface side. In general, when the solar cell module is seen from the surface side, the back sheet is seen around the solar battery cell, and the appearance can be improved by providing a colored layer on the back sheet so as to improve the decorativeness.

The coloring pigment used in the olefin-based polymer layer is not particularly limited as long as the pigment contains at least one selected from titanium oxide, carbon black, titanium black, black combined metal oxides, cyanine-based colors and quinacridone-based colors, and may be selected depending on demanded reflection properties and design properties. For example, titanium oxide, which is a white pigment, can be preferably used.

Among the titanium oxide, carbon black, titanium black and black combined metal oxides, titanium oxide is preferable from the viewpoint of reflection properties, cost and the like.

Here, the black combined metal oxide is preferably a combined metal oxide including at least one of iron, manganese, cobalt, chromium, copper and nickel, more preferably includes two or more of cobalt, chromium, iron, manganese, copper and nickel, and is more particularly preferably at least one or more pigments having a color index selected from PBk26, PBk27, PBk28 and PBr34.

Meanwhile, the PBk26 pigment is a combined oxide of iron, manganese or copper, the PBk-27 pigment is a combined oxide of iron, cobalt or chromium, the PBk-28 pigment is a combined oxide of copper, chromium or manganese, and the PBr34 is a combined oxide of nickel or iron.

Examples of the cyanine-based colors and quinacridone-based colors include cyanine green, cyanine blue, quinacridone red, phthalocyanine blue, phthalocyanine green and the like.

When, for example, a white pigment is used as the coloring pigment, the colored layer has a function of increasing the power generation efficiency by irregularly reflecting light of solar light incident from the front surface of the solar cell module, which has passed through the cell, so as to return the light to the cell.

The light reflectivity of the surface of the base material film on which the colored layer is disposed (outermost surface) at a wavelength of 550 nm can be adjusted to be increased by controlling the content or layer thickness of the coloring pigment in the colored layer in the above or following numeric ranges.

The volume average particle diameter of the coloring pigment is preferably 0.03 µm to 0.8 µm, and more preferably 0.15 µm to 0.5 µm. When the volume average particle diameter of the coloring pigment is set in the above range, it is possible to suppress a decrease in the light reflection efficiency.

The volume average particle diameter of the coloring pigment is a value measured using MICROTRAC FRA manufactured by Nikkiso Co., Ltd.

A preferable content of the coloring pigment in the olefin-based polymer layer (colored layer) varies depending on the kind or average particle diameter of a coloring pigment to be used. When the content of the coloring pigment in the colored layer is not too small, reflection properties and design properties can be sufficiently developed, and, the content being not too large is preferable from the viewpoint of the adhesion to the sealing material. In the protective sheet for a solar cell of the invention, the content of the coloring pigment in the colored layer is preferably 3 $g/m^2$ to 20 $g/m^2$, and more preferably 5 $g/m^2$ to 17 $g/m^2$ from the viewpoint of the above functions being sufficiently developed.

In the protective sheet for a solar cell of the invention, the volume fraction of the coloring pigment with respect to all the binder and the crosslinking agent included in the colored layer is preferably 15% to 200%, more preferably 20% to 150%, and particularly preferably 20% to 50% from the same viewpoint.

—Crosslinking Agent—

The olefin-based polymer layer contains a crosslinking agent. The detail of the crosslinking agent will be described in the description of a composition for forming the olefin-based polymer layer described below.

—Other Additives—

The olefin-based polymer layer can further contain a variety of additives, such as a surfactant, fine particles other than the coloring pigment, an ultraviolet absorbent and an antioxidant, and, particularly, the composition for forming a colored layer for forming the colored layer is preferably prepared using a surfactant for the dispersion stability of the coloring pigment.

As the surfactant, for example, a well-known anionic, cationic or nonionic surfactant can be used, and specific examples thereof include DEMOL EP [manufactured by KAO Corporation], NAROACTY CL95 [manufactured by Sanyo Chemical Industries, Ltd.] and the like. The surfactant may be used solely or in a mixture of a plurality of kinds.

Examples of fine particles other than the coloring pigment include inorganic oxide fillers, such as silica, magnesium oxide and tin oxide. Among the above, tin oxide or silica is preferable due to the slight degradation of the adhesion when the protective film is exposed to a hot and humid atmosphere.

The volume average particle diameter of the inorganic oxide filler is preferably 10 nm to 700 nm, and more preferably 20 nm to 300 nm. When an inorganic oxide filler having an average particle diameter in the above range is used, a favorable high adhesion to a layer adjacent to the colored layer can be obtained, and the adhesion to an adjacent layer (more particularly preferably the sealing material of the solar cell module, for example, a sealing material layer including EVA) particularly in a hot and humid environment (for example, 85° C., relative humidity 85%) can be developed. Meanwhile, the volume average particle diameter of the inorganic oxide filler is a value measured using MICROTRAC FRA manufactured by Nikkiso Co., Ltd.

The shape of the fine particles other than the coloring pigment is not particularly limited, and fine particles having a spherical form, an irregular form, a needle-like form or the like can be used.

The content of the fine particles other than the coloring pigment in the colored layer is preferably 5 mass % to 400 mass %, and more preferably 50 mass % to 300 mass % with respect to the total mass of the binder resin in the colored layer. When the content of the fine particles is 5 mass % or more, the adhesion when the protective sheet is exposed to a hot and humid atmosphere and the adhesion to the sealing material of the solar cell module when the protective sheet is aged in a hot and humid environment are favorable, and, when the content is 400 mass % or less, it is possible to prevent the degradation of the surface state of the colored layer.

Meanwhile, as the fine particles other than the inorganic oxide filler, for example, calcium carbonate, magnesium carbonate and the like may be included.

—Formation of the Olefin-Based Polymer Layer—

The olefin-based polymer layer can be formed using a well-known method, and there is no particular limitation. For example, the film may be formed through solution casting or melting using the base material film as a support and stacked, or the olefin-based polymer layer that has been formed through solution casting or melting on another support in advance and the base material film may be stacked through an adhesive or the like. Among the above, the protective sheet for a solar cell of the invention is preferably formed through solution casting using the base material film as a support. The method for forming a film through solution casting is not particularly limited, the film may be formed through casting or coating, and, in the readily adhesive sheet of the invention, the olefin-based polymer layer is preferably formed through coating.

The olefin-based polymer layers may be provided on both surfaces of the base material film as well as on a single surface of the base material film, and, even in this case, the olefin-based polymer layers are preferably coated on both surfaces of the base material film.

In addition, in a case in which the olefin-based polymer layer has the separate layer described below between the olefin-based polymer layer and the base material film, the olefin-based polymer layer can be formed directly on the base material film or on the separate layer through coating.

The composition for forming the olefin-based polymer layer, which is to form the olefin-based polymer layer, at least includes a binder, which is an olefin-based binder having an elastic modulus of 320 MPa or less, and the composition can be prepared by mixing a coloring pigment, another binder resin, an inorganic oxide filler, a crosslinking agent, additives and the like with a coating solvent as necessary.

[Solvent]

The coating solvent is not particularly limited as long as the respective components that configure the olefin-based polymer layer can be dispersed or dissolved, coated and then removed, water is preferably used, and 60 mass % or more of the solvent included in the composition for forming the olefin-based polymer layer is preferably water. The water-based composition described above is preferable since the composition does not easily apply load to the environment, and, when the fraction of water is 60 mass % or more, the water-based composition is advantageous in terms of explosion proof and safety. The fraction of water in the composition for forming the olefin-based polymer layer is desirably higher from the viewpoint of environmental load, and a case in which the fraction of water with respect to the entire solvent is 70 mass % or more is more preferable. In the readily adhesive sheet of the invention, the solvent remaining rate in the olefin-based polymer layer is preferably 0.05 mass % or less, more preferably 0.025 mass % or less, and particularly preferably 0.01 mass % or less with respect to the mass of the olefin-based polymer layer (mass of the coated film).

[Crosslinking Agent]

The composition for forming the olefin-based polymer layer contains a crosslinking agent.

When the composition for forming the olefin-based polymer layer contains a crosslinking agent, the binder resin included in the composition for forming the olefin-based polymer layer is crosslinked, and an adhesive and strong colored layer can be formed, which is preferable.

Examples of the crosslinking agent include epoxy-based crosslinking agents, isocyanate-based crosslinking agents, melamine-based crosslinking agents, carbodiimide-based crosslinking agents, oxazoline-based crosslinking agents and the like. Among the above, the oxazoline-based crosslinking agents (compounds having an oxazoline group) is particularly preferable from the viewpoint of securing adhesiveness to the sealing material of the solar cell module after the solar cell module is aged in a hot and humid environment.

The oxazoline-based crosslinking agent may be a low-molecular compound or a polymer which has two or more oxazoline groups in a molecule, and the oxazoline-based crosslinking agent is preferably a polymer since the adhesion is favorable.

Specific examples of the oxazoline-based crosslinking agent include, as the oxazoline-based crosslinking agent of the low-molecular compound, 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), 2,2'-(1,3-phenylene)-bis-(2-oxazoline), bis-(2-oxazolinyl cyclohexane)sulfide, bis-(2-oxazolinyl norbornane)sulfide and the like. Furthermore, (co)polymers of the above compounds can be preferably used as well.

The above oxazoline-based crosslinking agent may be used solely or in a mixture of two or more kinds.

The oxazoline-based crosslinking agent of a polymer can be obtained by using addition-polymerizable oxazoline as an essential component, and polymerizing addition-polymerizable oxazoline and a monomer component including a copolymerizable monomer.

Preferable examples of the addition-polymerizable oxazoline include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, 2-isopropenyl-5-ethyl-2-oxazoline, and the like, and the above addition-polymerizable oxazoline may be used solely or in a mixture of two or more kinds. Among the above, 2-isopropenyl-2-oxazoline is preferable since 2-isopropenyl-2-oxazoline is easily procurable and makes the adhesion favorable. The use amount of the addition-polymerizable oxazoline is not particularly limited, but the use amount is preferably set to 5 mass % or more, more preferably 5 mass % to 90 mass %, still more preferably 10 mass % to 60 mass %, and particularly preferably 30 mass % to 60 mass % with respect to the monomer component.

The copolymerizable monomer with the addition-polymerizable oxazoline is preferably selected from monomers that do not react with an oxazoline group, and examples thereof include (meth)acrylic acid esters such as methyl (meth)acrylic acid, ethyl (meth)acrylic acid, n-butyl (meth)acrylic acid, isobutyl (meth)acrylic acid, t-butyl (meth)acrylic acid, cyclohexyl(meth)acrylic acid, (meth)acrylic acid-2-ethylhexyl, (meth)acrylic acid methoxy polyethylene glycol, lauryl(meth)acrylic acid, stearyl(meth)acrylic acid, (meth)acrylic acid-2-hydroxy ethyl, (meth)acrylic acid-2-hydroxy propyl, monoester compound of (meth)acrylic acid and polyethyleneglycol, (meth)acrylic acid-2-aminoethyl and salts thereof, caprolactone-modified products of (meth) acrylic acid, (meth)acrylic acid-2,2,6,6-tetramethyl piperidine and (meth)acrylic acid-1,2,2,6,6-pentamethyl piperidine; (meth)acrylates such as sodium (meth)acrylate, potassium (meth)acrylate and ammonium (meth)acrylate; unsaturated nitriles such as acrylonitrile and methacrylonitrile; unsaturated amides such as (meth)acryl amide, N-methylol(meth)acryl amide and N-(2-hydroxyethyl) (meth)acryl amide; vinyl esters such as vinyl acetate and vinyl propionate; vinyl ethers such as methyl vinyl ether and ethyl vinyl ether; α-olefins such as ethylene and propylene; halogen-containing and α, β-unsaturated aliphatic hydrocarbons such as vinyl chloride, vinylidene chloride and vinyl fluoride; α, β-unsaturated aromatic hydrocarbons such as styrene, α-methyl styrene and sodium styrene sulfonate; and the like. The above copolymerizable monomer may be used solely or in a mixture of two or more kinds.

In the readily adhesive sheet of the invention, the oxazoline-based crosslinking agent, that is, the compound having the oxazoline group is preferably a copolymer including a (meth)acrylic acid ester unit.

The oxazoline-based crosslinking agent is preferably aqueous, such as water-soluble and/or water dispersible, since the mixing stability with the water dispersion of the acid-modified polyolefin resin is excellent, and more preferably water-soluble. The method for polymerizing the oxazoline-based crosslinking agent of the polymer is not particularly limited, and a well-known method can be employed. Examples thereof include a method in which the oxazoline-based crosslinking agent is solution-polymerized, emulsion-polymerized, suspension-polymerized or bulk-polymerized in an aqueous medium and the like, and it is possible to obtain an aqueous solution, a water dispersion and the like using the above method. The oxazoline-based crosslinking agent of the polymer preferably substantially contains no non-volatile aqueous auxiliary agent that makes the crosslinking agent aqueous in order to produce favorable adhesion or weather resistance.

The molecular weight of the oxazoline-based crosslinking agent of the polymer is preferably 1000 to 80000, more preferably 3000 to 60000, still more preferably 5000 to 40000, particularly preferably 8000 to 30000, and most preferably 10000 to 20000 in terms of number-average molecular weight. In a case in which the number-average molecular weight is less than 1000, there is a tendency of adhesion or weather resistance degrading, and, in a case in which the number-average molecular weight exceeds 80000, the manufacturing of the polymer becomes difficult.

In addition, a commercially available product may be used as the oxazoline-based crosslinking agent, and examples thereof that can be used include aqueous dispersion-type EPOCROS "K-1010E", "K-1020E", "K-1030E", K2010E, K2020E, K2030E, water-soluble-type WS500, WS700 (all EPOCROS series manufactured by Nippon Shokubai Co., Ltd.) and the like.

The content of the crosslinking agent with respect to the total mass of the solid content of the composition for forming the olefin-based polymer layer is preferably 5 mass % to 50 mass %, more preferably 10 mass % to 40 mass %, and particularly preferably in a range of 10% to 30% with respect to the total mass of the water-based binder. When the content of the crosslinking agent is set to 5 mass % or more, a sufficient crosslinking effect can be obtained, and it is possible to suppress a decrease in the strength of the olefin-based polymer layer or poor adhesion. On the other hand, when the content is 50 mass % or less, it is possible to prevent the degradation of the pot life of the composition for forming the olefin-based polymer layer.

The composition for forming the olefin-based polymer layer can be coated on the base material film using a well-known method, for example, a gravure coater or a bar coater.

In a case in which the composition for forming the olefin-based polymer layer includes a coloring pigment, the volume fraction of the coloring pigment with respect to the binder resin is 50% to 200% from the viewpoint of reflection performance and film strength, and the composition for forming the olefin-based polymer layer is preferably coated on the base material film so that the coated thickness becomes 1 µm to 20 µm. In addition, the composition is preferably coated so that the coating amount of the coloring pigment becomes 3 g/m$^2$ to 20 g/m$^2$.

(Separate Layer)

The protective sheet for a solar cell of the invention includes the olefin-based polymer layer on the base material film, and may include at least one separate layer between the olefin-based polymer layer and the base material film.

Meanwhile, an aspect in which the olefin-based polymer layer is in direct contact with the base material film is also preferable from the viewpoint of the reduction of manufacturing costs and an object of further reducing the thickness.

When the protective sheet for a solar cell includes the separate layer between the base material film and the olefin-based polymer layer, it is possible to further enhance the adhesion between the base material film and the olefin-based polymer layer.

In the protective sheet for a solar cell of the invention, the separate layer is preferably a basecoat layer, that is, the separate layer is preferably formed through coating.

Meanwhile, in the protective sheet for a solar cell of the invention, an aspect in which the separate layer is made only of an inorganic substance other than the inorganic oxide or an organic substance is also preferable. That is, an aspect in which the separate layer does not include the inorganic oxide is also preferable. For example, the separate layer is preferably formed using a method other than the deposition of the inorganic oxide, for example, coating. In addition, in a case in which the separate layer is formed through coating, an aspect in which fine particles of the inorganic oxide and the like are not included is also preferable.

Hereinafter, a case in which the protective sheet for a solar cell of the invention includes a basecoat layer, which is a preferable aspect of the separate layer, will be described.

The basecoat layer can be formed by coating a composition for forming the basecoat layer on the base material film.

The composition for forming the basecoat layer preferably contains at least a water-based binder.

Examples of the water-based binder include polyester, polyurethane, acrylic resins, polyolefin and the like, and, in the protective sheet for a solar cell of the invention, the main component of the separate layer is preferably a polyester-based resin.

Furthermore, the protective sheet for a solar cell may contain an epoxy-based crosslinking agent, an isocyanate-based crosslinking agent, a melamine-based crosslinking agent, a carbodiimide-based crosslinking agent, an oxazoline-based crosslinking agent, an anionic or nonionic surfactant, a filler such as silica, and the like in addition to the water-based binder. The preferable range of the above additives and the like is the same as the preferable range of the additives and the like in the olefin-based polymer layer.

The content of the water-based binder with respect to the total mass of the solid content of the composition for forming the basecoat layer is preferably 50 mass % to 100 mass %, and more preferably 70 mass % to 100 mass %.

The basecoat layer may contain a variety of additives, such as an inorganic oxide filler which will be described below, fine particles of a substance other than the inorganic oxide filler, an ultraviolet absorbent, an antioxidant and a surfactant.

The method for coating the water-based composition for forming the basecoat layer is not particularly limited.

As the coating method, for example, a gravure coater or a bar coater can be used.

Regarding the coating amount, the water-based composition for forming the basecoat layer is preferably coated on the base material film so that the layer thickness of the dried coated composition becomes preferably less than 10 µm, more preferably 0.05 µm to 2 µm, and particularly preferably 0.1 µm to 1.5 µm from the viewpoint of adhesion and surface state.

Water is used as the coating solvent for the water-based composition for forming the basecoat layer, and 60 mass % or more of the solvent included in the water-based composition for forming the basecoat layer is preferably water. The water-based composition is preferable since the composition does not easily apply load to the environment, and, when the fraction of water is 60 mass % or more, the water-based composition is advantageous in terms of explosion proof and safety.

The fraction of water in the water-based composition for forming the basecoat layer is desirably higher from the viewpoint of environmental load, and a case in which the fraction of water with respect to the entire solvent is 70 mass % or more is more preferable.

(Weather-Resistant Layer)

The protective sheet for a solar cell of the invention preferably further includes a weather-resistant layer containing at least one of a fluororesin and a silicone-acryl composite resin on a surface of the base material film opposite to a surface on which the olefin-based polymer layer is disposed.

Examples of the fluororesin included in the composition for forming the weather-resistant layer, which is to form the weather-resistant layer, include chlorotrifluoroethylene, tetrafluoroethylene, hexafluoropropylene, vinylidene fluoride, trifluoroethylene, chlorotrifluoroethylene and ethylene copolymer, tetrafluoroethylene and perfluoroalkyl vinyl ether copolymer. Among the above, chlorotrifluoroethylene and vinyl ether copolymer which is copolymerized with a vinyl-based compound is preferable from the viewpoint of solubility and weather resistance.

Examples of the fluororesin included in the composition for forming the weather-resistant layer include OBBLIGATO SW0011F [manufactured by AGC Coat-Tech Co., Ltd.].

The content of the fluororesin with respect to the total mass of the solid content of the composition for forming the weather-resistant layer is preferably 40 mass % to 90 mass % and more preferably 50 mass % to 80 mass % from the viewpoint of weather resistance and film strength.

Examples of the silicone-acryl composite resin included in the composition for forming the weather-resistant layer include CERANATE WSA1060 and WSA1070 (all manufactured by DIC Corp.), and H7620, H7630 and H7650 (all manufactured by Asahi Kasei Chemicals Corp.).

The content of the silicone-acryl composite resin with respect to the total mass of the solid content of the composition for forming the weather-resistant layer is preferably 40 mass % to 90 mass % and more preferably 50 mass % to 80 mass % from the viewpoint of weather resistance and film strength.

The coating amount of the composition for forming the weather-resistant layer is preferably set to 0.5 $g/m^2$ to 15 $g/m^2$, and more preferably set to 3 $g/m^2$ to 7 $g/m^2$ from the viewpoint of weather resistance and adhesion to the base material film.

The method for forming the composition for forming the weather-resistant layer is not particularly limited, but the composition is preferably formed through coating.

As the coating method, for example, a gravure coater or a bar coater can be used.

Water is preferably used as the coating solvent for the composition for forming the weather-resistant layer, and 60 mass % or more of the solvent included in the composition for forming the weather-resistant layer is preferably water. The water-based composition is preferable since the composition does not easily apply load to the environment, and, when the fraction of water is 60 mass % or more, the water-based composition is advantageous in terms of explosion proof and safety.

The fraction of water in the composition for forming the weather-resistant layer is desirably higher from the viewpoint of environmental load, and a case in which the fraction of water with respect to the entire solvent is 70 mass % or more is more preferable.

The weather-resistant layer may contain a variety of additives, such as an inorganic oxide filler, fine particles of a substance other than the inorganic oxide filler, an ultraviolet absorbent, an antioxidant and a surfactant.

The layer thickness of the weather-resistant layer is preferably 0.5 µm to 15 µm, and more preferably 3 µm to 7 µm. When the film thickness is 0.5 µm or more, sufficient weather resistance can be developed, and, when the film thickness is 15 µm or less, it is possible to suppress the degradation of the surface state.

Meanwhile, the weather-resistant layer may be a single layer or a laminate of two or more layers. The protective sheet for a solar cell of the invention is preferably configured by stacking two weather-resistant layers.

<Characteristics of the Readily Adhesive Sheet and the Protective Sheet for a Solar Cell>

(Light Reflectivity)

The surfaces of the readily adhesive sheet and the protective sheet for a solar cell of the invention, on which the olefin-based polymer layer is disposed, (outermost surfaces) preferably have a light reflectivity of 65% or more at a wavelength of 550 nm. When the light reflectivity is 65% or more, it is possible to sufficiently return light of solar light, which has transmitted through cells of the solar cell, to the cells, thereby increasing the power generation efficiency, which is preferable. The light reflectivity is more preferably 70% or more, particularly preferably 75% or more, and more particularly preferably 80% or more.

[Back Sheet Member for a Solar Cell and Back Sheet for a Solar Cell]

The back sheet member for a solar cell or back sheet for a solar cell of the invention includes the protective sheet for a solar cell of the invention. In addition, the protective sheet for a solar cell of the invention may be used as it is as the back sheet member for a solar cell or back sheet for a solar cell of the invention.

[Laminate for a Solar Cell]

The laminate for a solar cell of the invention includes the protective sheet for a solar cell and the polymer layer which is directly adhered to at least the surface of the protective sheet for a solar cell on the olefin-based polymer layer side and includes an ethylene-vinyl acetate copolymer or polyvinyl butyral.

Since the protective sheet for a solar cell of the invention is favorably adhesive to the sealing material (for example EVA or PVB, particularly EVA) used in the solar cell module on the surface on the olefin-based polymer layer side, the protective sheet and the sealing material can be adhered to each other without an adhesive layer or the like. In addition, in a laminate for a solar cell in which a sealing material such as an ethylene-vinyl acetate copolymer is directly adhered to at least the surface of the protective sheet for a solar cell on the olefin-based polymer layer side, the adhesion between the sealing material and the protective sheet is favorable for a long period of time even after the laminate film is aged in a hot and humid environment.

The above laminate for a solar cell may be used as a sealing material that seals a solar cell element as it is, or may be used as a part of the sealing material of the solar cell module.

[Solar Cell Module]

The protective sheet for a solar cell of the invention is preferable for manufacturing of a solar cell module.

The solar cell module is configured by, for example, disposing a solar cell element that converts the light energy of solar light into electric energy between a transparent substrate on which solar light enters and the back sheet for a solar cell of the invention, and sealing the gap between the substrate and the back sheet using a sealing material such as ethylene-vinyl acetate copolymer.

Members other than the solar cell module, the solar battery cell and the back sheet are described in detail in, for example, "Constituent materials of solar power generation system" (edited by Eiichi Sugimoto, Kogyo Chosakai Publishing Co., Ltd., published in 2008).

A first aspect of the solar cell module of the invention includes a transparent front substrate on a side on which sun light enters, a solar cell element, a sealing material that seals the solar cell element, and a back sheet for a solar cell which is disposed on the sealing material on an opposite side to the front substrate and is adhered to the sealing material, in which the back sheet for a solar cell includes the back sheet member for a solar cell or the back sheet for a solar cell of the invention, and the olefin-based polymer layer in the back sheet member for a solar cell or the back sheet for a solar cell is directly adhered to the sealing material.

A second aspect of the solar cell module of the invention includes a transparent front substrate on a side on which sun light enters, a solar cell element, a sealing material that seals the solar cell element, and a back sheet for a solar cell which is disposed on the sealing material on an opposite side to the front substrate and is adhered to the sealing material, in which the laminate for a solar cell of the invention is included as the back sheet for a solar cell and the sealing material.

The solar cell module can be preferably configured by providing the solar cell element, the sealing material that seals the solar cell element, a surface protective member that adheres to the sealing material and protects a light-receiving surface side, and a rear surface protective member that adheres to the sealing material and protects an opposite side to the light-receiving surface, including ethylene-vinyl acetate copolymer (EVA) in the sealing material, using the back sheet for a solar cell of the invention as the rear surface protective member, and directly adhering the colored layer in the back sheet for a solar cell to the sealing material. When the solar cell module is configured in the above manner, the back sheet for a solar cell is adhered to EVA for a long period of time even in a hot and humid environment, and it is possible to make the solar cell module serve for a long service life.

The transparent front substrate simply needs to be light transmissible so as to allow solar light to transmit through, and can be appropriately selected from base materials that allow light to transmit through. From the viewpoint of power generation efficiency, the light transmittance is preferably higher, and, for example, a glass substrate, a transparent resin such as an acrylic resin, or the like can be preferably used as the substrate.

As the solar cell element, it is possible to apply a variety of well-known solar cell elements, such as silicon-based elements such as single-crystal silicon, polycrystal silicon and amorphous silicon; III-V group or II-VI group compound semiconductor-based elements such as copper-indium-gallium-selenium, copper-indium-selenium, cadmium-tellurium and gallium-arsenic.

EXAMPLES

Hereinafter, the characteristics of the invention will be more specifically described using examples.

Materials, use amounts, fractions, treatment contents, treatment sequences and the like described in the following examples can be appropriately modified within the scope of the purport of the invention. Therefore, the ranges for the invention are not supposed to be restrictively interpreted by specific examples described below. Meanwhile, unless particularly otherwise described, "parts" are by mass.

Meanwhile, the volume average particle diameter is measured using MICROTRAC FRA manufactured by Nikkiso Co., Ltd.

Example 1

<Production of a Base Material Film>

—Synthesis of Polyester—

A slurry of 100 kg of high-purity terephthalic acid (manufactured by Mitsui Chemicals, Inc.) and 45 kg of ethylene glycol (manufactured by Nippon Shokubai Co., Ltd.) was sequentially supplied over 4 hours to an esterification tank which had been loaded with approximately 123 kg of bis(hydroxyethyl)terephthalate in advance and held at a temperature of 250° C. and a pressure of $1.2 \times 10^5$ Pa, and an esterification reaction was caused over additional one hour even after the end of the supply. After that, 123 kg of the obtained esterification reaction product was transferred to a polycondensation reaction tank.

Subsequently, 0.3 mass % of ethylene glycol with respect to a polymer to be obtained was added in the polycondensation reaction tank to which the esterification reaction product had been transferred. After 5 minutes of stirring, an ethylene glycol solution of cobalt acetate and manganese acetate was added so that the contents became 30 ppm and 15 ppm with respect to the polymer to be obtained respectively. After another 5 minutes of stirring, an ethylene glycol solution of 2 mass % of a titanium alkoxide compound was added so that the content became 5 ppm with respect to the polymer to be obtained. After 5 minutes, an ethylene glycol solution of 10 mass % of diethyl phosphono ethyl acetate was added so that the content became ppm with respect to the polymer to be obtained. After that, the temperature of the reaction system was gradually increased from 250° C. to 285° C., and the pressure was decreased to 40 Pa while stirring the low polymer at 30 rpm. The times elapsed for the final temperature and the final pressure to be reached were both set to 60 minutes. When the stirring torque reached a predetermined value, the reaction system was purged with nitrogen gas, returned to normal pressure, and the polycondensation reaction was stopped. In addition, the resulting product was ejected into cold water in a strand form, and immediately cut, thereby producing polymer pellets (having a diameter of approximately 3 mm and a length of approximately 7 mm). Meanwhile, the time elapsed for the stirring torque to reach the predetermined value from the beginning of depressurization was 3 hours.

Here, as the titanium alkoxide compound, the titanium alkoxide compound (content of Ti=4.44 mass %) synthesized in Example 1 in paragraph number [0083] of JP-A-2005-340616 was used.

—Solid-State Polymerization—

The above-obtained pellets were held in a vacuum container held at 40 Pa at a temperature of 220° C. for 30 hours, thereby carrying out solid-state polymerization.

—Formation of the Base—

The pellets that had been subjected to solid-state polymerization as described above were melted at 280° C., and cast on a metal drum, thereby producing unstretched bases having a thickness of approximately 3 mm. After that, the bases were stretched in the vertical direction at 90° C. by 3 times, and further stretched in the horizontal direction at 120° C. by 3.3 times. Thereby, biaxial stretched polyethylene terephthalate films (hereinafter referred to as "PET base material films") having a thickness of 250 μm were obtained.

<Formation of the Basecoat Layer and the Colored Layer>

—Preparation of a Coating Liquid for the Basecoat Layer 1—

The components of the following composition were mixed so as to prepare a coating liquid for the basecoat layer 1.

(Composition for the Coating Liquid for the Basecoat Layer 1)

| | |
|---|---|
| Water dispersion of a polyester resin [VYLONAL 1245 manufactured by Toyobo Co., Ltd., solid content: 30 mass %] | 48 parts by mass |
| Fine particles of a PMMA resin [MP-1000 manufactured by Soken Chemical Engineering Co., Ltd., solid content: 100 mass %] | 0.5 parts by mass |
| Oxazoline compound [EPOCROS WS-700 manufactured by Nippon Shokubai Co., Ltd., solid content: 25 mass %] | 3 parts by mass |
| Carbodiimide compound [CARBODILITE V-02-L2 manufactured by Nisshinbo Industries, Inc., solid content: 40 mass %] | 4.3 parts by mass |
| Polyoxy alkylene alkyl ether [NAROACTY CL-95 manufactured by Sanyo Chemical Industries, Ltd., solid content: 100 mass %] | 0.15 parts by mass |
| Distilled water | 935 parts by mass |

—Preparation of a White Inorganic Fine Particle Dispersion 1—

The components of the following composition were mixed, and the mixture was subjected to a dispersion treatment using a dyno mill-type disperser, thereby obtaining a white inorganic fine particle dispersion 1 having a volume average particle diameter of 0.42 μm.

(Composition of White Inorganic Fine Particle Dispersion 1)

| | |
|---|---|
| Titanium dioxide [TIPAQUE R-780-2 manufactured by Ishihara Sangyo Kaisha, Ltd., solid content: 100 mass %; white pigment] | 765 parts by mass |
| 10% aqueous solution of polyvinyl alcohol (PVA-105) [PVA-105 manufactured by Kuraray Co., Ltd., solid content: 100 mass %] | 383 parts by mass |
| Surfactant [DEMOL EP manufactured by Kao Corporation, solid content: 25 mass %] | 9.2 parts by mass |
| Distilled water | 363 parts by mass |

—Preparation of a Silica Dispersion Liquid 1—

The components of the following composition were mixed, and the mixture was subjected to a dispersion treatment using an altimizer disperser, thereby preparing a silica dispersion liquid 1 (concentration: 10%).

| | |
|---|---|
| Distilled water | 900 parts by mass |
| Silica particles [OX-50 manufactured by Nippon Aerosil Co., Ltd.] | 100 parts by mass |

—Preparation of a Coating Liquid for Colored Layer 1—

The components of the following composition were mixed, thereby preparing a coating liquid for the colored layer 1.

(Composition of the Coating Liquid for Colored Layer 1)

| | |
|---|---|
| The above-obtained white inorganic fine particle dispersion 1 | 1520 parts by mass |
| Polyolefin resin water dispersion <<binder for the colored layer>> [ARROW BASE SE-1013N manufactured by Unitika Ltd., solid content: 20.2 mass %] | 823 parts by mass |
| Polyoxy alkylene alkyl ether [NAROACTY CL-95 manufactured by Sanyo Chemical Industries, Ltd., solid content: 100 mass %] | 0.71 parts by mass |
| Water-soluble oxazoline compound [EPOCROS WS-700 manufactured by Nippon Shokubai Co., Ltd., solid content: 25 mass %] | 84.62 parts by mass |
| The above-obtained silica dispersion liquid 1 | 56.4 parts by mass |
| Distilled water | 413 parts by mass |

—Formation of the Basecoat Layer and the Colored Layer—

A single surface of a PET base material film was transported at a transportation rate of 80 m/minute, subjected to a corona discharge treatment under a condition of 730 J/m$^2$, and then the coating liquid for basecoat layer 1 was coated using a bar coating method so that the dried weight became 124 mg/m$^2$. In addition, the coating liquid was dried at 180° C. for 1 minute so as to form a basecoat layer. Subsequently, the coating liquid for colored layer 1 was coated on the basecoat layer using a bar coating method so that the coloring pigment (titanium oxide) became 8 g/m$^2$, and then dried at 170° C. for 1 minute, thereby obtaining a white PET film having a basecoat layer having a dried thickness of 0.1 μm and a white colored layer (olefin-based polymer layer) having a dried thickness of 9 μm stacked in this order on the single surface of the PET base material film.

—Measurement of the Elastic Modulus of the Binder for the Colored Layer (Olefin-Based Polymer Layer)—

The elastic modulus of the binder used in the colored layer of the white base material PET film was measured using the following method.

A binder-only film (film thickness: approximately 100 microns) was formed on a CERAPIRU HP2 (manufactured by Toray Advanced Film Co., Ltd.), and only the binder-only film was smoothly peeled off so as to prevent the film from being stretched. The obtained binder-only film was cut into 5 mm×50 mm, and a tension test was carried out at 25° C. in a 50% environment under conditions of an inter-chuck distance of 20 mm and a cross head speed of 50 mm/minute using a TENSILON®-50 manufactured by Orientec Co., Ltd. The obtained data were analyzed using a data processing software for general-purpose testing, and elastic moduli were computed from stress-strain curves.

The obtained results were described in Table 1.

<Formation of the Weather-Resistant Layer>

The following first weather-resistant layer and the following first weather-resistant layer were formed in this order on an opposite surface to a surface of the white base material PET film on which the white colored layer was coated.

—Preparation of a White Inorganic Fine Particle Dispersion 2—

The components described in the following composition of the white inorganic fine particle dispersion 2 were mixed, and the mixture was subjected to a dispersion treatment for 1 hour using a dyno mill-type disperser, thereby obtaining a fine particle dispersion 2 having a volume average particle diameter of 0.42 μm.

(Composition of the White Inorganic Fine Particle Dispersion 2)

| | |
|---|---|
| Titanium dioxide (white pigment, volume average particle diameter 0.42 μm) [TIPAQUE R-780-2 manufactured by Ishihara Sangyo Kaisha, Ltd., solid content: 100 mass %] | 7.98 parts by mass |
| 10% aqueous solution of polyvinyl alcohol (PVA-105) [PVA-105 manufactured by Kuraray Co., Ltd., solid content: 100 mass %] | 10 parts by mass |
| Surfactant [DEMOL EP manufactured by Kao Corporation, solid content: 25%] | 0.1 parts by mass |
| Distilled water | 1.92 parts by mass |

—Preparation of a Coating Liquid for Forming the First Weather-Resistant Layer—

The respective components described in the following composition of a coating liquid for forming the first weather-resistant layer were mixed, thereby preparing a coating liquid for forming the first weather-resistant layer.

(Composition of the Coating Liquid for Forming the First Weather-Resistant Layer)

| | |
|---|---|
| Acryl/silicone-based binder (silicone-based resin) [CERANATE WSA-1070 manufactured by DIC Corp., solid content: 40%] | 362.3 parts by mass |
| Carbodiimide compound [CARBODILITE V-02-L2 manufactured by Nisshinbo Industries, Inc., solid content: 40%] | 48.3 parts by mass |
| Surfactant [NAROACTY CL-95 manufactured by Sanyo Chemical Industries, Ltd., solid content: 1%] | 9.7 parts by mass |
| The white inorganic fine particle dispersion 2 | 157.0 parts by mass |
| Distilled water | 422.7 parts by mass |

—Formation of the First Weather-Resistant Layer—

The opposite surface to the surface of the white PET film on which the white colored layer was coated was transported at a transportation rate of 80 m/minute, and subjected to a corona discharge treatment under a condition of 730 J/m$^2$. After that, the coating liquid for forming the first weather-resistant layer was coated on the surface on which the corona discharge treatment had been carried out so that the amount of the silicone-based resin became 3.0 g/m$^2$ in terms of the coating amount, and dried at 180° C. for 1 minute, thereby forming a first weather-resistant layer having a dried thickness of 3 μm.

—Preparation of a Coating Liquid for Forming the Second Weather-Resistant Layer—

The respective components described in the following composition of a coating liquid for forming the second weather-resistant layer were mixed, thereby preparing a coating liquid for forming the second weather-resistant layer.

(Composition of the Coating Liquid for Forming the Second Weather-Resistant Layer)

| | |
|---|---|
| Acryl/silicone-based binder (silicone-based resin) [CERANATE WSA-1070 manufactured by DIC Corp., solid content: 40%] | 362.3 parts by mass |
| Carbodiimide compound (crosslinking agent) [CARBODILITE V-02-L2 manufactured by Nisshinbo Industries, Inc., solid content: 40%] | 24.2 parts by mass |
| Surfactant [NAROACTY CL-95 manufactured by Sanyo Chemical Industries, Ltd., solid content: 1%] | 24.2 parts by mass |
| Distilled water | 703.8 parts by mass |

—Formation of the Second Weather-Resistant Layer—

The obtained coating liquid for forming the second weather-resistant layer was coated on the first weather-resistant layer so that the amount of the silicone-based resin became 2.0 g/m$^2$ in terms of the coating amount, and dried at 180° C. for one minute, thereby forming a second weather-resistant layer having a dried thickness of 2.5 μm.

In the above manner, a protective sheet for a solar cell provided with the basecoat layer and the white colored layer were provided on the single surface of the PET base material film and the first weather-resistant layer and the second weather-resistant layer on the opposite surface of the PET base material film was produced. The protective sheet for a solar cell was used as a protective sheet for a solar cell of Example 1.

<Evaluation of the Protective Sheet for a Solar Cell>

The adhesion to the sealing agent, adhesion to sealing agent after aged in a hot and humid environment, reflectivity and weather resistance of the protective sheet for a solar cell of Example 1 were evaluated using the following methods. The obtained results are described in Table 1.

—1. Adhesion to the Sealing Agent Before being Aged in a Hot and Humid Environment—

The protective sheet for a solar cell produced in the above manner was cut into 20 mm-wide×150 mm pieces, thereby preparing two test specimens. The two test specimens were disposed so that the white layers faced each other, an EVA sheet (RC02B, EVA sheet manufactured by Mitsui Chemicals Fabro, Inc.) cut into a 20 mm-wide×100 mm-long piece was sandwiched between the test specimens, and the specimens were hot-pressed using a vacuum laminator (vacuum laminating machine manufactured by Nisshinbo Holdings Inc.), thereby being adhered to the EVA sheet. The adhering conditions at this time were set as follows.

The test specimens were vacuumed at 150° C. for 3 minutes using the vacuum laminator, and then pressed for 10 minutes, thereby being adhered. Thereby, a test specimen for evaluating adhesion having no adhered EVA in a 50 mm portion from one end of two mutually adhered sample specimens and the EVA sheet adhered to the remaining 100 mm portion was obtained.

The EVA-unadhered portion of the obtained test specimen for evaluating adhesion (the portion 50 mm from one end of the specimen) was sandwiched using the top and bottom clips of a TENSILON (RTC-1210A manufactured by ORIENTEC Co., Ltd.), and a tension test was carried out at a peeling angle of 180° and a tension rate of 300 mm/minute, thereby measuring the adhesive force.

The test specimens were ranked based on the measured adhesive forces according to the following evaluation criteria. Among the ranks, Ranks 4 and 5 are in a practically permissible range.

(Evaluation Criteria)

5: Adhesion was particularly excellent (60 N/20 mm or more)

4: Adhesion was extremely favorable (30 N/20 mm to less than 60 N/20 mm)

3: Adhesion was favorable (20 N/20 mm to less than 30 N/20 mm)

2: Poor adhesion was caused (10 N/20 mm to less than 20 N/20 mm)

1: Poor adhesion was significant (less than 10 N/20 mm)

—2. Adhesion to the Sealing Agent after Aged in a Hot and Humid Environment—

The protective sheet for a solar cell produced in the above manner was held for 48 hours under environmental conditions of 105° C. and a relative humidity of 100% (aged in a hot and humid environment), then, test specimens were prepared in the same manner as in the adhesion to the sealing agent before being aged in a hot and humid environment, the adhesive force with the EVA sheet was measured, and the test specimens were ranked according to the same evaluation criteria. Meanwhile, regarding the adhesion to the sealing agent after aged in a hot and humid environment, Ranks 3 or higher are in a practically permissible range, and Ranks 4 and 5 are in a more preferable practical range.

—3. Reflectivity—

For the protective sheets for a solar cell produced in the above manner, the reflectivity with respect to light at 550 nm was measured using a spectrophotometer UV-3100 (manufactured by Shimadzu Corporation). The reflectivity of a barium sulfate standard plate was measured as a reference, and the reflectivity of the protective sheet for a solar cell was computed with an assumption that the reflectivity of the barium sulfate standard plate was 100%.

—4. Weather Resistance—

For the protective sheets for a solar cell produced in the above manner, light was radiated for 14 days from the opposite surface of the colored layer under conditions of a BPT temperature of 35° C., a relative humidity of 50% and a radiant illumination of 390 W/m$^2$ using a low-temperature cycle xenon weather meter XL75 (manufactured by Suga Test Instruments Co., Ltd.).

b values before and after the radiation were measured using a spectrophotometer CM3700d manufactured by Konica Minolta, Inc., and Δb of 1 or more was evaluated as Δ, and Δb of 1 or less was evaluated as O.

—5. General Evaluation—

The protective sheets for a solar cell produced in the above manner were generally evaluated according to the following evaluation criteria. Among the criteria, Ranks 3 or higher is in a practically permissible range, and Ranks 4 and 5 are in a more preferable practical range.

(Evaluation Criteria)

6: Reflectivity of 75% or more EVA adhesion evaluation 5

5: Reflectivity of less than 75% EVA adhesion evaluation 5

4: EVA adhesion evaluation 4

3: EVA adhesion evaluation 3

2: EVA adhesion evaluation 2

1: EVA adhesion evaluation 1

Examples 2 to 24, Comparative Examples 1 to 6 and 10 to 12

Protective sheets for a solar cell of Examples 2 to 24 and Comparative Examples 1 to 6 and 10 to 12 were manufactured and evaluated in the same manner as in Example 1 except that the polyolefin resin water dispersion [ARROW BASE SE-1013N manufactured by Unitika Ltd., solid content: 20.2 mass %; the binder for the colored layer] in the coating liquid for the colored layer 1 was changed to binders described below so that the solid content became the same, and, furthermore, the presence of a basecoat liquid, the presence of the weather-resistant layer, the kind of the pigment, the coating amount of the pigment, the pigment ratio and the kind of the crosslinking agent were changed as described in Table 1.

(The Kinds and Main Chain Structures of the Binders Used in the Respective Examples and the Respective Comparative Examples)

B1: ARROW BASE SE-1013N manufactured by Unitika Ltd., solid content: 20.2 mass %, olefin-based;

B2: CHEMIPEARL S75N manufactured by Mitsui Chemicals, Inc., solid content: 24%, olefin-based;

B3: HITECH S3148 manufactured by Toho Chemical Industry Co., Ltd., solid content: 25%, olefin-based;

B4: HITECH S3121 manufactured by Toho Chemical Industry Co., Ltd., solid content: 25%, olefin-based;

B5: CHEMIPEARL S120 manufactured by Mitsui Chemicals, Inc., solid content: 27%, olefin-based;

B6: JONCRYL PDX7341 manufactured by BASF Ltd., solid content: 49%, acryl-based;

B7: SUPER FLEX 460, manufactured by Daiichi Kogyo Seiyaku Co., Ltd., solid content: 38.1%, urethane-based;

B8: VINYBLAN GV681 manufactured by Nissin Chemical Co., Ltd., solid content: 50%, vinyl chloride-based;

B9: VYLONAL MD-1200 manufactured by Toyobo Co., Ltd., solid content: 34%, polyester-based;

B10 product name: ARROW BASE SD-1010 manufactured by Unitika Ltd., solid content: 20%, olefin-based;

B11: product name ARROW BASE SB-1010 manufactured by Unitika Ltd., solid content: 25%, olefin-based;

B12: product name CHEMIPEARL EV210H manufactured by Mitsui Chemicals, Inc., solid content: 40%, vinyl acetate unit-containing olefin-based;

B13: product name ARROW BASE TD-4010 manufactured by Unitika Ltd., solid content: 25%, an olefin-based binder having a main chain of polypropylene;

Meanwhile, the weight ratios of B1 and B7 in Example 14 were set to 8:2.

(The Kinds and Addition Fractions of the Pigments Used in the Respective Examples and the Respective Comparative Examples)

In Example 19, the above titanium oxide and the above carbon black were used as the coloring pigment so that the mass ratio after the drying of the coating became 3:1.

In Example 20, the above titanium oxide and titanium black (product name TB dispersion liquid 13M manufactured by Mitsubishi Materials Corporation) were used as the coloring pigment so that the mass ratio after the drying of the coating became 1:1.

In Example 21, the above titanium oxide and combined oxide black (C. I. Pigment Black 26, an iron, manganese and copper combined oxide, MF-5533 Black manufactured by Dainichiseika Color & Chemicals Mfg. Co., Ltd., solid content 61.5%) were used as the coloring pigment so that the mass ratio became 3:1.

In Example 22, the above titanium oxide, cyanine green (product name AF GREEN E-1 manufactured by Dainichiseika Color & Chemicals Mfg. Co., Ltd.), cyanine blue (product name AF BLUE E-2B manufactured by Dainichiseika Color & Chemicals Mfg. Co., Ltd.) and quinacridone red (product name AF RED E-17 manufactured by Dainichiseika Color & Chemicals Mfg. Co., Ltd.) were used as the coloring pigment so that the mass ratio after the drying of the coating became 8:1:0.5:2.

(The Kinds of the Crosslinking Agents Used in the Respective Examples and the Respective Comparative Examples)

The water-soluble carbodiimide compound described in Example 17 in Table 1 is a CARBODILITE V-02-L2 (product name) manufactured by Nisshinbo Industries, Inc. having a solid content of 40%, and the water-dispersible (water-insoluble) oxazoline (latex-type oxazoline) compound described in Example 18 in Table 1 is a EPOCROS K-2030E (product name) manufactured by Nippon Shokubai Co., Ltd. having a solid content of 40%. Meanwhile, regarding the coating amount, the compounds were added so that the equivalent number of reaction sites became the same as WS700 used in Example 1.

The evaluation results obtained from the respective examples and the respective comparative examples were described in Table 1.

Comparative Examples 7 and 8

In Comparative Examples 7 and 8, the following coloring pigment-containing polyethylene was extruded from a coating hanger die to the base material film of Example 1 at a molten resin temperature of 320° C., and laminated on the base material film, thereby manufacturing a laminate of the base material film and the colored layer. After that, a weather-resistant layer was stacked in the same manner as in Example 1 so as to produce protective sheets for a solar cell of Comparative Examples 7 and 8, and the protective sheets were evaluated. The evaluation results obtained from the respective comparative examples were described in Table 1.

(Production of Pigment-Containing Master Batch A)

Coloring pigment (A250, manufactured by Ishihara Sangyo Kaisha, Ltd., titanium oxide) 40 parts Low-density polyethylene (LC607K manufactured by Japan Polyethylene Corporation) 60 parts (Production of Coloring Pigment-Containing Polyethylene)

Pigment-containing master batch A 35 parts

Low-density polyethylene (SUMIKATHENE L405H manufactured by Sumitomo Chemical Company, Limited) 15 parts Comparative Example 9

In Comparative Example 9, the colored layer was smoothly peeled off from a laminate manufactured in the same manner as in Comparative Example 7 so as to prevent the colored layer from being stretched. The following adhesive was coated on the base material film of Example 1 so that the solid content became 5 g/m$^2$, and dried at 100° C. for 2 minutes. After that, the colored layer was stacked, vacuumed for 3 minutes in a vacuum laminator that had been heated to 80° C., then pressed for 5 minutes, adhered to the base material film, and, furthermore, aged in an oven at 70° C. for 24 hours.

(Adhesive)

| | |
|---|---|
| DUX-1070 (manufactured by Dainichiseika Color & Chemicals Mfg. Co., Ltd., highly durable non-yellowing polyurethane-based adhesive, solid content 50%) | 30 parts by mass |
| C-99 (Dainichiseika Color & Chemicals Mfg. Co., Ltd., aliphatic non-yellowing polyisocyanate curing agent, solid content 100%) | 1 part by mass |
| Ethyl acetate | 21 parts by mass |

After that, the weather-resistant layer was stacked in the same manner as in Example 1 so as to produce a protective sheet for a solar cell of Comparative Example 9, and the protective sheet was evaluated.

The evaluation results obtained from Comparative Example 9 were described in Table 1. Meanwhile, the total thickness of the colored layer and the adhesive layer in the protective sheet for a solar cell of Comparative Example 9 was described in the layer thickness of the colored layer column in Table 1.

TABLE 1

| | Weather-resistant layer | Basecoat layer | Colored layer | | | | | | | | | |
|---|---|---|---|---|---|---|---|---|---|---|---|---|
| | | | Binder | | | | Coloring pigment | | | Crosslinking agent | | Layer thickness of colored layer [μm] |
| | | | Kind | Main chain | Main chain of olefin resin | Melting point of olefin resin [°C] | Elastic modulus [MPa] | Kind of pigment | Amount of pigment [g/m$^2$] | Volume fraction | Kind of crosslinking agent | |
| Example 1 | Yes | Yes | B1 | Olefin-based | Ethylene | 91 | 49.5 | Titanium oxide | 8 | 100% | Water-soluble oxazoline | 9 |
| Example 2 | Yes | Yes | B1 | Olefin-based | Ethylene | 91 | 49.5 | Titanium oxide | 12 | 100% | Water-soluble oxazoline | 13 |
| Example 3 | Yes | Yes | B1 | Olefin-based | Ethylene | 91 | 49.5 | Titanium oxide | 8 | 50% | Water-soluble oxazoline | 10 |
| Example 4 | Yes | Yes | B1 | Olefin-based | Ethylene | 91 | 49.5 | Titanium oxide | 8 | 150% | Water-soluble oxazoline | 11 |
| Example 5 | No | Yes | B1 | Olefin-based | Ethylene | 91 | 49.5 | Carbon black | 0.5 | 20% | Water-soluble oxazoline | 2 |
| Example 6 | Yes | No | B1 | Olefin-based | Ethylene | 91 | 49.5 | Titanium oxide | 8 | 100% | Water-soluble oxazoline | 9 |
| Example 7 | Yes | Yes | B1 | Olefin-based | Ethylene | 91 | 49.5 | Titanium oxide | 8 | 100% | Water-soluble oxazoline | 9 |
| Example 8 | Yes | Yes | B1 | Olefin-based | Ethylene | 91 | 49.5 | Titanium oxide | 4 | 100% | Water-soluble oxazoline | 5 |
| Example 9 | Yes | Yes | B1 | Olefin-based | Ethylene | 91 | 49.5 | Titanium oxide | 15 | 100% | Water-soluble oxazoline | 17 |
| Example 10 | Yes | Yes | B2 | Olefin-based | Ethylene | 76 | 79.3 | Titanium oxide | 8 | 100% | Water-soluble oxazoline | 9 |
| Example 11 | Yes | Yes | B3 | Olefin-based | Ethylene | 74 | 304.9 | Titanium oxide | 8 | 100% | Water-soluble oxazoline | 9 |
| Example 12 | Yes | Yes | B4 | Olefin-based | Ethylene | 77 | 139.7 | Titanium oxide | 8 | 100% | Water-soluble oxazoline | 9 |
| Example 13 | Yes | Yes | B13 | Olefin-based | Propylene | 70 | 45.5 | Titanium oxide | 8 | 100% | Water-soluble oxazoline | 2 |
| Example 14 | Yes | Yes | B1/B7 = 8:2 | Olefin-based/urethane-based | Ethylene | 91 | 38.5 | Titanium oxide | 8 | 100% | Water-soluble oxazoline | 9 |
| Example 15 | Yes | Yes | B1 | Olefin-based | Ethylene | 91 | 49.5 | Titanium oxide | 8 | 20% | Water-soluble oxazoline | 9 |
| Example 16 | Yes | Yes | B1 | Olefin-based | Ethylene | 91 | 49.5 | Titanium oxide | 8 | 25% | Water-soluble oxazoline | 9 |
| Example 17 | Yes | Yes | B1 | Olefin-based | Ethylene | 91 | 49.5 | Titanium oxide | 8 | 100% | Water-soluble carbodiimide | 9 |
| Example 18 | Yes | Yes | B1 | Olefin-based | Ethylene | 91 | 49.5 | Titanium oxide | 8 | 100% | Water-insoluble oxazoline | 9 |
| Example 19 | Yes | Yes | B1 | Olefin-based | Ethylene | 91 | 49.5 | Titanium oxide/carbon black | 8 | 25% | Water-soluble oxazoline | 9 |
| Example 20 | Yes | Yes | B1 | Olefin-based | Ethylene | 91 | 49.5 | Titanium oxide/titanium black | 8 | 25% | Water-soluble oxazoline | 9 |
| Example 21 | Yes | Yes | B1 | Olefin-based | Ethylene | 91 | 49.5 | Titanium oxide/combined oxide black | 8 | 25% | Water-soluble oxazoline | 9 |
| Example 22 | Yes | Yes | B1 | Olefin-based | Ethylene | 91 | 49.5 | Titanium oxide/cyanine green, cyanine blue, quinacridone red | 8 | 25% | Water-soluble oxazoline | 9 |
| Example 23 | Yes | Yes | B10 | Olefin-based | Ethylene | 105 | 62 | Titanium oxide | 8 | 100% | Water-soluble oxazoline | 9 |
| Example 24 | Yes | Yes | B11 | Olefin-based | Ethylene | 80 | 45.3 | Titanium oxide | 8 | 100% | Water-soluble oxazoline | 9 |

TABLE 1-continued

Evaluation of protective sheet for solar cell

| | Adhesion to sealing agent | | | | Reflectivity | Weather | General evaluation | |
|---|---|---|---|---|---|---|---|---|
| | Before aged in hot and humid environment | | After aged in hot and humid environment | | 550 nm [%] | resistance | As back sheet member | As back sheet |
| | [N/20 mm] | Evaluation | [N/20 mm] | Evaluation | | | | |
| Example 1 | 80 | 5 | 70 | 5 | 82 | ○ | 6 | 6 |
| Example 2 | 30 | 4 | 20 | 3 | 86 | ○ | 6 | 3 |
| Example 3 | 85 | 5 | 70 | 5 | 78 | ○ | 6 | 6 |
| Example 4 | 60 | 5 | 40 | 4 | 84 | ○ | 6 | 4 |
| Example 5 | 30 | 4 | 20 | 3 | 5 | ○ | 6 | 3 |
| Example 6 | 80 | 5 | 70 | 5 | 79 | △ | 6 | 4 |
| Example 7 | 40 | 5 | 30 | 4 | 82 | ○ | 6 | 5 |
| Example 8 | 100 | 5 | 80 | 5 | 65 | ○ | 6 | 3 |
| Example 9 | 30 | 4 | 20 | 3 | 89 | ○ | 6 | 4 |
| Example 10 | 45 | 4 | 30 | 4 | 81 | ○ | 6 | 4 |
| Example 11 | 50 | 4 | 35 | 4 | 82 | ○ | 6 | 4 |
| Example 12 | 50 | 4 | 30 | 4 | 81 | ○ | 6 | 4 |
| Example 13 | 30 | 4 | 20 | 3 | 82 | ○ | 6 | 3 |
| Example 14 | 70 | 5 | 40 | 4 | 81 | ○ | 6 | 4 |
| Example 15 | 80 | 5 | 65 | 5 | 74 | ○ | 6 | 5 |
| Example 16 | 85 | 5 | 70 | 5 | 76 | ○ | 6 | 6 |
| Example 17 | 70 | 5 | 50 | 4 | 82 | ○ | 6 | 4 |
| Example 18 | 60 | 5 | 40 | 4 | 82 | ○ | 6 | 4 |
| Example 19 | 80 | 5 | 60 | 5 | 6 | ○ | 6 | 5 |
| Example 20 | 75 | 5 | 60 | 5 | 6 | ○ | 6 | 5 |
| Example 21 | 80 | 5 | 65 | 5 | 18 | ○ | 6 | 5 |
| Example 22 | 65 | 5 | 60 | 5 | 14 | ○ | 6 | 5 |
| Example 23 | 80 | 5 | 60 | 5 | 82 | ○ | 6 | 6 |
| Example 24 | 40 | 5 | 30 | 4 | 82 | ○ | 6 | 4 |

TABLE 1-continued

| | Weather-resistant layer | Basecoat layer | Colored layer Binder | | | | Colored layer Coloring pigment | | | Crosslinking agent | Layer thickness of colored layer [μm] |
|---|---|---|---|---|---|---|---|---|---|---|---|
| | | | Kind | Main chain | Main chain of olefin resin | Melting point of olefin resin [° C.] | Elastic modulus [MPa] | Kind of pigment | Amount of pigment [g/m²] | Volume fraction | Kind of crosslinking agent | |
| Comparative Example 1 | Yes | Yes | B5 | Olefin-based | Ethylene | 74 | 340.5 | Titanium oxide | 8 | 100% | Water-soluble oxazoline | 9 |
| Comparative Example 2 | Yes | Yes | B6 | Acryl-based | | | 306.5 | Titanium oxide | 8 | 100% | Water-soluble oxazoline | 9 |
| Comparative Example 3 | Yes | Yes | B7 | Urethane-based | | | 11.8 | Titanium oxide | 8 | 100% | Water-soluble oxazoline | 9 |
| Comparative Example 4 | Yes | Yes | B8 | Vinyl chloride-based | | | 2125 | Titanium oxide | 8 | 100% | Water-soluble oxazoline | 9 |
| Comparative Example 5 | Yes | Yes | B9 | Polyester-based | | | 2589 | Titanium oxide | 8 | 100% | Water-soluble oxazoline | 9 |
| Comparative Example 6 | Yes | No | B1 | Olefin-based | Ethylene | 91 | 49.5 | — | 0 | 0% | Water-soluble oxazoline | 2 |
| Comparative Example 7 | Yes | No | — | Polyethylene | | 110 | 30.2 | Titanium oxide | 10.5 | 9% | — | 20 |
| Comparative Example 8 | Yes | No | — | Polyethylene | | 110 | 30.2 | Titanium oxide | 25 | 9% | — | 45 |
| Comparative Example 9 | Yes | No | — | Polyethylene | | 110 | 30.2 | Titanium oxide | 10.5 | 9% | — | 24 |
| Comparative Example 10 | Yes | Yes | B12 (vinyl acetate-containing unit) | Olefin-based | Ethylene | 78 | 400.5 | Titanium oxide | 8 | 100% | Water-soluble oxazoline | 9 |
| Comparative Example 11 | Yes | Yes | B1 | Olefin-based | Ethylene | 91 | 49.5 | Titanium oxide | 8 | 100% | — | 9 |
| Comparative Example 12 | Yes | Yes | B1 | Olefin-based | Ethylene | 91 | 49.5 | — | 0 | 0% | — | 9 |

TABLE 1-continued

| | Evaluation of protective sheet for solar cell | | | | | | | |
|---|---|---|---|---|---|---|---|---|
| | Adhesion to sealing agent | | | | Reflectivity | Weather | General evaluation | |
| | Before aged in hot and humid environment | | After aged in hot and humid environment | | 550 nm [%] | resistance | As back sheet member | As back sheet |
| | [N/20 mm] | Evaluation | [N/20 mm] | Evaluation | | | | |
| Comparative Example 1 | 20 | 3 | 15 | 2 | 81 | ○ | | 2 |
| Comparative Example 2 | 10 | 2 | 10 | 2 | 82 | ○ | | 2 |
| Comparative Example 3 | 30 | 4 | 10 | 2 | 81 | ○ | | 2 |
| Comparative Example 4 | 10 | 2 | 5 | 1 | 80 | ○ | | 1 |
| Comparative Example 5 | 20 | 3 | 10 | 2 | 82 | ○ | | 2 |
| Comparative Example 6 | 50 | 4 | 10 | 2 | 12 | ○ | | 2 |
| Comparative Example 7 | 2 | 1 | 1 | 1 | 81 | ○ | | 1 |
| Comparative Example 8 | 2 | 1 | 1 | 1 | 89 | ○ | | 1 |
| Comparative Example 9 | 10 | 2 | 2 | 1 | 81 | ○ | | 1 |
| Comparative Example 10 | 20 | 3 | 15 | 2 | 81 | ○ | | 2 |
| Comparative Example 11 | 60 | 5 | 10 | 2 | 81 | ○ | | 2 |
| Comparative Example 12 | 50 | 4 | 10 | 2 | 12 | ○ | | 2 |

It was found from Table 1 that the protective sheet for a solar cell of the invention was superior to the protective sheets for a solar cell of Comparative Examples particularly in terms of adhesion to the sealing material after aged in a hot and humid environment. Furthermore, it was also found that the protective sheet for a solar cell of the invention was also favorable in terms of adhesion to the sealing material, reflectivity and weather resistance before being aged in a hot and humid environment. That is, when generally evaluated, it was found that the protective sheet for a solar cell of the invention had excellent performances as a back sheet member for a solar cell and as a back sheet for a solar cell.

On the other hand, the protective sheet for a solar cell of Comparative Example 1 was an aspect in which an olefin-based binder having an elastic modulus beyond the range regulated by the invention was used as the binder for the colored layer, and was poor particularly in terms of adhesion to the sealing material after aged in a hot and humid environment and, when generally evaluated, poor in terms of performances as a back sheet for a solar cell.

The protective sheets for a solar cell of Comparative Examples 2 and 3 were aspects in which an acryl-based binder and a urethane-based binder were used respectively as the binder for the colored layer, and were all poor particularly in terms of adhesion to the sealing material after aged in a hot and humid environment and, when generally evaluated, poor in terms of performances as a back sheet for a solar cell.

The protective sheets for a solar cell of Comparative Examples 4 and 5 were aspects in which a vinyl chloride-based binder and a polyester-based binder having an elastic modulus significantly beyond the range regulated by the invention were used respectively as the binder for the colored layer, and were all poor particularly in terms of adhesion to the sealing material after aged in a hot and humid environment and, when generally evaluated, poor in terms of performances as a back sheet for a solar cell.

The protective sheet for a solar cell of Comparative Example 6 was an aspect in which the colored layer was formed without adding the specific coloring pigment (titanium or the like) used in the invention, and was poor particularly in terms of adhesion to the sealing material after aged in a hot and humid environment and, when generally evaluated, poor in terms of performances as a back sheet for a solar cell.

The protective sheets for a solar cell of Comparative Examples 7 to 9 were aspects in which the colored layers were formed through solution casting without adding a crosslinking agent, and were all poor particularly in terms of adhesion to the sealing material after aged in a hot and humid environment and, when generally evaluated, poor in terms of performances as a back sheet for a solar cell.

The protective sheet for a solar cell of Comparative Example 10 was an aspect in which an olefin-based binder having an elastic modulus beyond the range regulated by the invention and including the vinyl acetate unit was used as the binder for the colored layer, and was poor particularly in terms of adhesion to the sealing material after aged in a hot and humid environment and, when generally evaluated, poor in terms of performances as a back sheet for a solar cell.

The protective sheet for a solar cell of Comparative Example 11 was an aspect in which the colored layer was formed without adding a crosslinking agent, and was poor particularly in terms of adhesion to the sealing material after aged in a hot and humid environment and, when generally evaluated, poor in terms of performances as a back sheet for a solar cell.

The protective sheet for a solar cell of Comparative Example 12 was an aspect in which the colored layer was formed without adding the specific coloring pigment (titanium or the like) and a crosslinking agent, and was poor particularly in terms of adhesion to the sealing material after aged in a hot and humid environment and, when generally evaluated, poor in terms of performances as a back sheet for a solar cell.

Meanwhile, it was confirmed that the protective sheets for a solar cell of the respective examples, which are the readily adhesive sheet of the invention, had a solvent remaining rate in the olefin-based polymer layer of 0.01 mass % or less with respect to the mass of the olefin-based polymer layer (mass of the coated film).

Example 101

<Production and Evaluation of a Solar Cell Module>

A 3 mm-thick piece of tempered glass, an EVA sheet (RC02B manufactured by Mitsui Chemicals Fabro, Inc.), a crystalline solar battery cell, an EVA sheet (RC02B manufactured by Mitsui Chemicals Fabro, Inc.) and the protective sheet for a solar cell produced in each of the respective examples were stacked in this order, and hot-pressed using a vacuum laminator (vacuum laminating machine manufactured by Nisshinbo Holdings Inc.), thereby adhering the EVA to the respective members. At this time, the protective sheet for a solar cell of each Example was disposed so that the colored layer came into contact with the EVA sheet. In addition, the adhering method is as follows.

The colored layer and the EVA sheet were vacuumed at 150° C. for 3 minutes using a vacuum laminator, and then pressed for 10 minutes so as to be adhered.

A crystalline solar cell module was produced in the above manner. Power was generated using the obtained solar cell modules, all the solar cells exhibited favorable power generation performances, and were stably operated for a long period of time.

Examples 201 to 224

Furthermore, when protective sheets for a solar cell were manufactured in the same manner as in Examples 1 to 24 except that the coating liquids for coloring 1 were prepared without using the silica dispersion liquid 1, the same results as in Examples 1 to 24 were obtained.

REFERENCE SIGNS LIST 10 solar cell module
12 second weather-resistant layer
14 first weather-resistant layer
16 base material film
17 separate layer (basecoat layer)
18 olefin-based polymer layer
20 solar cell element
22 sealing material
24 transparent front substrate
31 back sheet member for solar cell (an aspect of readily adhesive sheet)
32 back sheet for solar cell (another aspect of readily adhesive sheet)

While the present invention has been described in detail and with reference to specific embodiments thereof, it will be apparent to one skilled in the art that various changes and modifications can be made therein without departing from the spirit and scope thereof.

The present disclosure relates to the subject matter contained in International Application No. PCT/JP2012/055767, filed Mar. 7, 2012; and Japanese Application No. 2011-049491, filed Mar. 7, 2011, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. An adhesive sheet comprising:
   a base material film; and
   an olefin-based polymer layer which is disposed on at least one surface of the base material film and contains at least one binder, which is an olefin-based binder having at least one coloring pigment and a crosslinking agent,
   wherein the at least one coloring pigment is a material selected from the group consisting of titanium oxide, carbon black, titanium black, black combined metal oxides, cyanine-based colors and quinacridone-based colors,
   wherein the olefin-based binder is an acid-modified olefin-based binder,
   wherein the olefin-based binder has an elastic modulus of 30 to 70 MPa, and
   wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

2. The adhesive sheet according to claim 1,
   wherein the acid modification is (meth)acrylic acid.

3. The adhesive sheet according to claim 1,
   wherein a copolymerization ratio (molar ratio) of an olefin unit to an acid unit in the olefin-based binder is in a range of 99.9:0.1 to 90:10.

4. The adhesive sheet according to claim 1,
   wherein a melting point of the olefin-based binder is 75° C. or higher.

5. The adhesive sheet according to claim 1,
   wherein a main chain of the olefin-based binder includes an ethylene unit.

6. The adhesive sheet according to claim 1,
   wherein the olefin-based binder includes a (meth)acrylic acid ester unit.

7. The adhesive sheet according to claim 1,
   wherein an amount of the at least one coloring pigment contained in the olefin-based polymer layer would equate to a coating weight of 3 g/m$^2$ to 20 g/m$^2$ if it was coated on the base by itself.

8. The adhesive sheet according to claim 1,
   wherein a volume fraction of the at least one coloring pigment with respect to a total volume of all the binder resin and the crosslinking agent is 20% to 200% in the olefin-based polymer layer.

9. The adhesive sheet according to claim 1,
   wherein the at least one coloring pigment is titanium oxide.

10. The adhesive sheet according to claim 1,
    wherein a thickness of the olefin-based polymer layer is 30 μm or less.

11. The adhesive sheet according to claim 1,
    wherein the olefin-based polymer layer is manufactured through coating.

12. The adhesive sheet according to claim 1,
    wherein a solvent remaining rate in the olefin-based polymer layer is 0.05 mass % or less.

13. The adhesive sheet according to claim 1,
    wherein the olefin-based polymer layer and the base material film are in direct contact with each other.

14. The adhesive sheet according to any claim 1, further comprising:
    a weather-resistant layer including at least one of a fluororesin and a silicone-acryl composite resin on a surface of the base material film opposite to a surface on which the olefin-based polymer layer is disposed.

15. The adhesive sheet according to claim 1,
    wherein a surface of the base material film on which the olefin-based polymer layer is disposed has a light reflectivity of 65% or more at a wavelength of 550 nm.

16. The adhesive sheet according to claim 1,
    wherein the olefin-based binder has an elastic modulus of 30 to 49.5 MPa.

17. The adhesive sheet according to claim 1 further comprising:
    at least one separate layer between the olefin-based polymer layer and the base material film,
    wherein the crosslinking agent is a compound having an oxazoline group, and
    wherein the at least one coloring pigment is a material selected from the group consisting of titanium oxide and carbon black.

18. The adhesive sheet according to claim 1,
    wherein a main chain of the olefin-based binder includes an ethylene unit, and
    wherein an amount of the at least one coloring pigment contained in the olefin-based polymer layer would equate to a coating weight of 3 g/m$^2$ to 8 g/m$^2$ if it was coated on the base by itself.

19. The adhesive sheet according to claim 1,
    wherein the crosslinking agent is a compound having an oxazoline group.

20. The adhesive sheet according to claim 19,
    wherein a mass fraction of the compound having an oxazoline group with respect to the olefin-based binder is in a range of 10% to 30%.

21. The adhesive sheet according to claim 19,
    wherein the compound having an oxazoline group is water-soluble.

22. The adhesive sheet according to claim 19,
    wherein the compound having an oxazoline group is a copolymer including a (meth)acrylic acid ester unit.

23. The adhesive sheet according to claim 1 further comprising:
    at least one separate layer between the olefin-based polymer layer and the base material film.

24. The adhesive sheet according to claim 23,
    wherein a thickness of the separate layer is less than 2 μm.

25. The adhesive sheet according to claim 23,
wherein a main component of the separate layer is a polyester-based resin.

26. A protective sheet for a solar cell comprising an adhesive sheet, wherein the adhesive sheet comprises a base material film; and an olefin-based polymer layer which is disposed on at least one surface of the base material film and contains at least one binder, which is an olefin-based binder having at least one coloring pigment and a crosslinking agent,
wherein the at least one coloring pigment is a material selected from the group consisting of titanium oxide, carbon black, titanium black, black combined metal oxides, cyanine-based colors and quinacridone-based colors,
wherein the olefin-based binder is an acid-modified olefin-based binder,
wherein the olefin-based binder has an elastic modulus of 30 to 70 MPa, and
wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

27. A back sheet member for a solar cell or a back sheet for a solar cell comprising an adhesive sheet, wherein the adhesive sheet comprises a base material film; and an olefin-based polymer layer which is disposed on at least one surface of the base material film and contains at least one binder, which is an olefin-based binder having at least one coloring pigment and a crosslinking agent,
wherein the at least one coloring pigment is a material selected from the group consisting of titanium oxide, carbon black, titanium black, black combined metal oxides, cyanine-based colors and quinacridone-based colors,
wherein the olefin-based binder is an acid-modified olefin-based binder,
wherein the olefin-based binder has an elastic modulus of 30 to 70 MPa, and
wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

28. A laminate for a solar cell comprising an adhesive sheet and a polymer layer which is directly adhered to at least a surface of the adhesive sheet on an olefin-based polymer layer side and includes an ethylene-vinyl acetate copolymer, wherein the adhesive sheet comprises a base material film; and an olefin-based polymer layer which is disposed on at least one surface of the base material film and contains at least one binder, which is an olefin-based binder having at least one coloring pigment and a crosslinking agent,
wherein the at least one coloring pigment is a material selected from the group consisting of titanium oxide, carbon black, titanium black, black combined metal oxides, cyanine-based colors and quinacridone-based colors,
wherein the olefin-based binder is an acid-modified olefin-based binder,
wherein the olefin-based binder has an elastic modulus of 30 to 70 MPa, and
wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

29. A solar cell module comprising:
a transparent front substrate on a side on which sun light enters;
a solar cell element;
a sealing material that seals the solar cell element; and
a back sheet for a solar cell which is disposed on the sealing material on an opposite side to the front substrate and is adhered to the sealing material,
wherein the back sheet for a solar cell includes a back sheet member for a solar cell or a back sheet for a solar cell, and an olefin-based polymer layer in the back sheet member for a solar cell or the back sheet for a solar cell is directly adhered to the sealing material,
wherein the back sheet member for a solar cell or the back sheet for a solar cell comprises an adhesive sheet, in which the adhesive sheet comprises a base material film; and the olefin-based polymer layer which is disposed on at least one surface of the base material film and contains at least one binder, which is an olefin-based binder having at least one coloring pigment and a crosslinking agent,
wherein the at least one coloring pigment is a material selected from the group consisting of titanium oxide, carbon black, titanium black, black combined metal oxides, cyanine-based colors and quinacridone-based colors,
wherein the olefin-based binder is an acid-modified olefin-based binder,
wherein the olefin-based binder has an elastic modulus of 30 to 70 MPa, and
wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

30. A solar cell module comprising:
a transparent front substrate on a side on which sun light enters;
a solar cell element;
a sealing material that seals the solar cell element; and
a back sheet for a solar cell which is disposed on the sealing material on an opposite side to the front substrate and is adhered to the sealing material,
wherein a laminate for a solar cell is included as the back sheet for a solar cell and the sealing material,
wherein the laminate for a solar cell comprises an adhesive sheet and a polymer layer which is directly adhered to at least a surface of the adhesive sheet on an olefin-based polymer layer side and includes an ethylene-vinyl acetate copolymer, in which the adhesive sheet comprises a base material film; and an olefin-based polymer layer which is disposed on at least one surface of the base material film and contains at least one binder, which is an olefin-based binder having at least one coloring pigment and a crosslinking agent, wherein the at least one coloring pigment is a material selected from the group consisting of titanium oxide, carbon black, titanium black, black combined metal oxides, cyanine-based colors and quinacridone-based colors, wherein the olefin-based binder is an acid-modified olefin-based binder, wherein the olefin-based binder has an elastic modulus of 30 to 70 MPa, and wherein the adhesion between a readily adhesive sheet and a sealing material including an ethylene-vinyl acetate copolymer after the readily adhesive sheet is disposed on the sealing material and aged for 48 hours under environmental conditions of 105° C. and a relative humidity of 100%, is 20 N/20 nm or greater at a peeling angle of 180° and a tension rate of 300 mm/minute.

* * * * *